(12) United States Patent
Thomas et al.

(10) Patent No.: US 7,200,430 B2
(45) Date of Patent: Apr. 3, 2007

(54) LOCALIZED TWO-DIMENSIONAL SHIFT CORRELATED MR SPECTROSCOPY OF HUMAN BRAIN

(75) Inventors: Michael Albert Thomas, Los Angeles, CA (US); Kenneth Yue, Los Angeles, CA (US)

(73) Assignee: The Regents of the University of California, Oakland, CA (US)

( * ) Notice: Subject to any disclaimer, the term of this patent is extended or adjusted under 35 U.S.C. 154(b) by 576 days.

(21) Appl. No.: 10/221,385

(22) PCT Filed: Mar. 29, 2001

(86) PCT No.: PCT/US01/10227

§ 371 (c)(1),
(2), (4) Date: Nov. 21, 2002

(87) PCT Pub. No.: WO01/73479

PCT Pub. Date: Oct. 4, 2001

(65) Prior Publication Data

US 2003/0208120 A1    Nov. 6, 2003

(51) Int. Cl.
*A61B 5/05* (2006.01)

(52) U.S. Cl. .................. 600/410; 600/407; 600/413

(58) Field of Classification Search ................ 600/410; 324/307
See application file for complete search history.

(56) References Cited

U.S. PATENT DOCUMENTS

| | | | | |
|---|---|---|---|---|
| 4,714,884 A | * | 12/1987 | Glover | 324/309 |
| 4,843,321 A | * | 6/1989 | Sotak | 324/309 |
| 5,045,790 A | * | 9/1991 | Hall et al. | 324/307 |
| 5,064,638 A | * | 11/1991 | Moore et al. | 324/310 |
| 5,111,819 A | * | 5/1992 | Hurd | 600/410 |
| 5,168,225 A | * | 12/1992 | Yamazaki et al. | 324/307 |
| 5,617,861 A | * | 4/1997 | Ross et al. | 600/410 |
| 6,005,390 A | * | 12/1999 | Watanabe et al. | 324/307 |

* cited by examiner

*Primary Examiner*—Brian L. Casler
*Assistant Examiner*—James Kish
(74) *Attorney, Agent, or Firm*—Berliner & Associates

(57) ABSTRACT

A two-dimensional (2D) chemical shift correlated MR spectroscopic (COSY) sequence integrated into a new volume localization technique (90°-180°-90°) for whole body MR Spectroscopy. Using the product operator formalism, a theoretical calculation of the volume localization as well as the coherence transfer efficiencies in 2D MRS is presented. A combination of different MRI transmit/receive rf coils is used. The cross peak intensities excited by the proposed 2D sequence are asymmetric with respect to the diagonal peaks. Localized COSY spectra of cerebral frontal and occipital gray/white matter regions in fifteen healthy controls are presented.

11 Claims, 9 Drawing Sheets

FIG. 8a
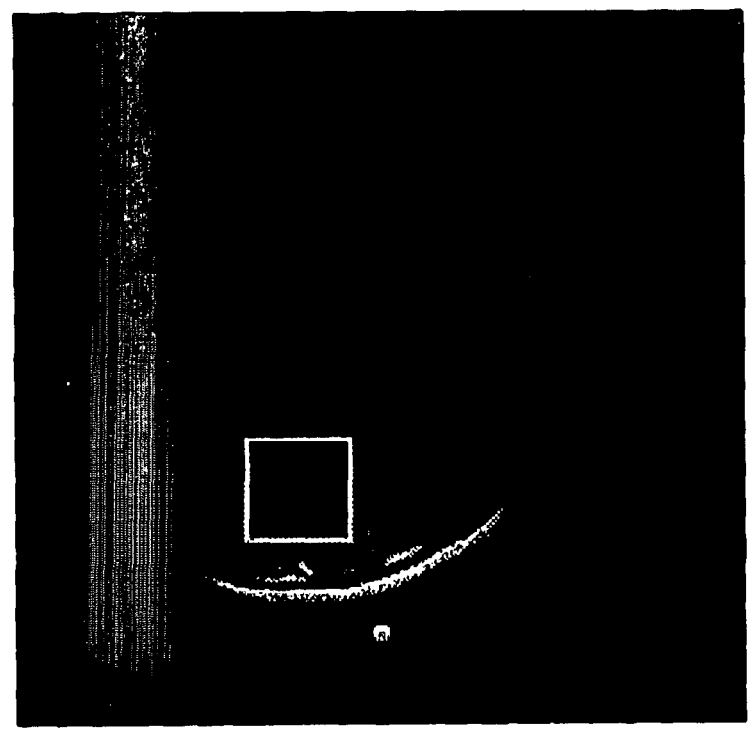
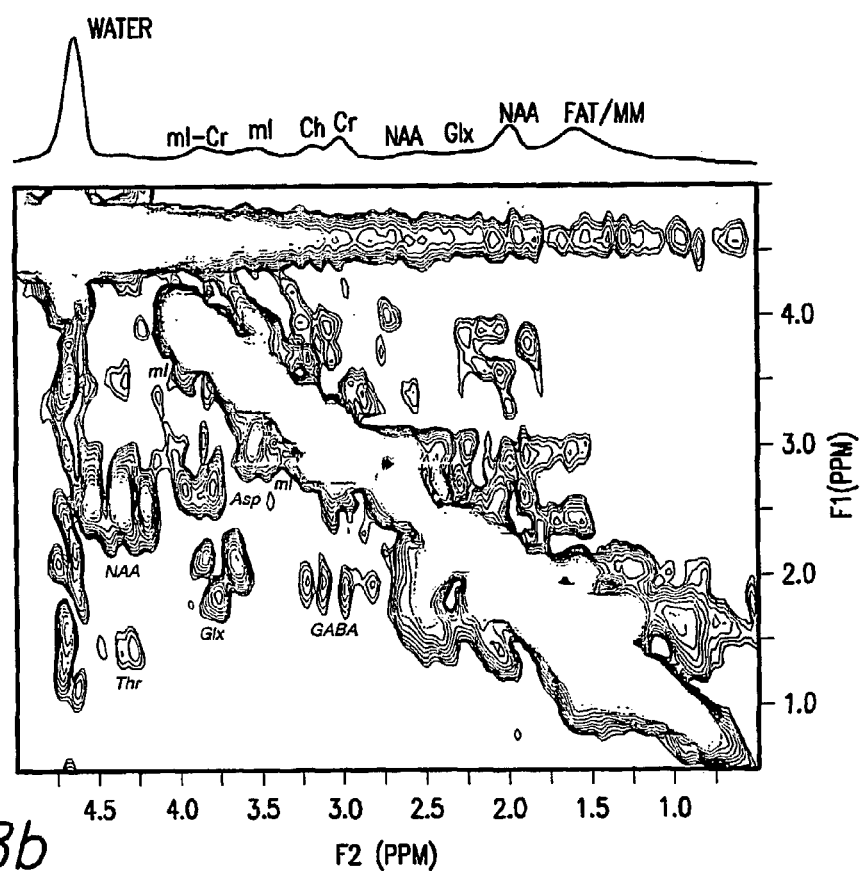
FIG. 8b

LOCALIZED TWO-DIMENSIONAL SHIFT CORRELATED MR SPECTROSCOPY OF HUMAN BRAIN

FIELD OF THE INVENTION

The field of the invention is MR Spectroscopy.

BACKGROUND OF THE INVENTION

Due to the recent improvements in $B_0$ gradient and rf coils, $^1H$ MR spectra have been recorded in the human brain with excellent water suppression. Using TE (Time for a spin Echo) as short as 15 ms, several cerebral metabolites have been identified; see Hanstock, C C, Rothman, D L, Prichard, J W, Jue, T, Shulman, R G, (1988), "Spatially Localized NMR spectra of metabolites in the human brain", *PNAS (USA)*, 85:18215; Braun H, Frahm J, Gyngell M L, Merboldt K D, Hanicke W and Suter R, (1989), "Cerebral metabolism in man after acute stroke: New observation using localized proton NMR Spectroscopy", *Magn Reson Med*, 9: 126–131; Kuzniecky R, Hetherington H, Pan J, et al., (1997), "Proton spectroscopic imaging at 4.1 tesla in patients with malformations of cortical development and epilepsy", *Neurology*, 48:1018–1024; Barberi E A, Gai J S, Rutt B K and Menon R S, (2000), "A transmit-only/receive only (TORO) system for high field MRI/MRS applications", *Magn Reson Med*, 43:284–289. During the past decade, alterations in several metabolites, namely N-acetylaspartate (NAA), glutamate/glutamine (Glx), choline (Ch), creatine (Cr), myo-inositol (ml) and γ-aminobutyrate (GABA) have been reported in different pathologies; see Kreis R, Ross B D, Farrow N and Ackerman Z, (1992), "Metabolic disorders of the brain in chronic hepatic encephalopathy detected with $^1H$ MR Spectroscopy", *Radiology*, 182: 9–27; Chang L, Ernst T, Yee M L, Walot I and Singer E., (1999), "Cerebral metabolite abnormalities correlate with clinical severity of HIV-1 cognitive motor complex", *Neurology*, 52:100–108; Thomas M A, Huda A, Guze B et al., (1998), Cerebral $^1H$ MR "Spectroscopy and Neuropsychological status of patients with Hepatic Encephalopathy", *Am. J. Roentgenology*, 171: 1123–1130; Thomas M A, Ke Y, Levitt J, et al., (1998), "Preliminary Study of Frontal Lobe $^1H$ MR Spectroscopy in Childhood-Onset Schizophrenia", *J Magn Reson Ima*, 8:841–846; Narayana P A, Doyle T J, Lai D and Wolinsky J S, (1998), "Serial proton magnetic resonance spectroscopic imaging, contrast-enhanced magnetic resonance imaging, and quantitative lesion volumetry in Multiple Scelerosis", *Ann Neurol*, 43:56–71; Haseler L J, Sibbitt W L, Mojtahedzadeh H N, et al., (1998), "Proton MR spectroscopic measurement of neurometabolites in HE during oral Lactulose Therapy", *AJNR*, 19:1681–1686. Absolute quantitation of cerebral metabolites has also been reported for only a few metabolites with a limited success in vivo; see Michelis T, Merboldt K D, Bruhn H, Hanicke W, and Frahm J, (1993), "Absolute concentrations of metabolites in the adult human brain in vivo: Quantification of localized proton MR Spectra", *Radiology*, 187: 219–227; Ernst T, Kreis R and Ross B D, (1993), "Absolute Quantitation of water and metabolites in the human brain. I. Compartments and water", *J Magn Reson, B* 102: 1–8; Rothman, D I, Petroff, OAC, Behar, K L and Mattson, R H, (1993), "Localized $^1H$ NMR measurements of γ-aminobutyric acid in human brain in vivo", *Proc Natl Acad Sci USA*, 90: 5662–5666.

Due to severe overlap of these metabolites, an unambiguous assignment of J-coupled metabolite multiplets is severely hindered at 1.5T field strength.

One-dimensional (1D) MR spectral editing techniques, used to unravel the overlapping resonance, rely on J-coupled proton metabolites, which have well separated multiplets. However, techniques based on subtraction methodology are very sensitive to motion artifacts leading to subtraction errors. An additional drawback is that only one metabolite can be identified at a time. Successful attempts in editing GABA and glutamate using whole body MRI/MRS scanners have been presented by other researchers; see Rothman et al., supra; Behar K L, Rothman D L, Spencer D D, Petroff O A C, (1994), "Analysis of macromolecule resonance in $^1H$ NMR spectra of human brain", *Magn Reson Med*, 32:294–302; Pan J W, Mason G F, Vaughan J T,Chu W J, Zhang Y and Hetherington, (1997), "$^{13}C$ Editing of glutamate in human brain using J-refocused coherence transfer spectroscopy", *Magn Reson Med*, 37:355–35. Single-shot based multiple-quantum filtered MR spectroscopic sequences have also been implemented on whole body scanners, but a severe loss of signal associated with various coherence transfer pathways made it less attractive to human applications; see Keltner J R, Wald L L, Frederick B d B, Renshaw P F, (1997), "In vivo detection of GABA in human brain using a localized double-quantum filter technique", *Magn Reson Med*, 37:366–371; Thomas M A, Hetherington H P, Meyerhoff D J and Twieg D, (1991), "Localized Double Quantum filtered NMR Spectroscopy", *J Magn Reson, B*93: 485–496; Wilman A, Allen P, (1993), "In vivo NMR detection strategies for gamma-aminobutyric acid, utilizing proton spectroscopy and coherence-pathway filtering with gradients", *J Magn Reson*, B101: 165–171.

A localized version of a two-dimensional (2D) J-resolved MR spectroscopic (JPRESS) sequence, using the Point Resolved Spectroscopic Sequence (PRESS} sequence for volume localization, was proposed recently; see Ryner L N, Sorenson J A and Thomas M A, (1995), "3D localized 2D NMR Spectroscopy on an MRI scanner", *J.Magn.Reson*, series B,107: 126–137; Ryner L N, Sorenson J A and Thomas M A, (1995), "Localized 2D J-Resolved $^1H$ MR Spectroscopy: Strong coupling effects in vitro and in vivo", *Magn.Reson. Ima.*, 13: 853–869; Thomas M A, Ryner L N, Mehta M, Turski P and Sorenson J A, (1996), *J. Magnetic Resonance Imaging*, 6: 453–459. Even though the JPRESS sequence retains 100% of the magnetization from a localized volume of interest (VOI), the strong coupling effect inherent at 1.5 T field strength resulted in a complex 2D cross peak pattern for NAA, glutamate/glutamine, GABA and other cerebral metabolites; see Ryner et al., ("Localized 2D J-Resolved . . . "), supra. Moreover, some of the 2D cross peaks were heavily $T_2$-weighted during the long incremental delays necessitated by the second dimension of the JPRESS spectrum. An oversampled 2D J-resolved sequence has also been proposed recently; see Hurd R E, Gurr D and Sailasuta N, (1998), Proton Spectroscopy without water suppression: the oversampled J-resolved experiment, *Magn Reson Med*, 40:343–34. In addition, homonuclear decoupled in vivo $^1H$ MR spectra using constant time chemical shift encoding were presented by Leibfritz and co-workers; see Dreher W and Leibfritz D, (1999), "Detection of Homonuclear Decoupled in vivo proton NMR spectra using constant time chemical shift encoding: CT-PRESS", *Magn Reson Ima*, 17:141–150.

Compared to the localized 2D JPRESS spectra, a better dispersion of J-cross peaks is conceivable in a COSY spectrum, albeit a larger spectral window needs to be sampled during the evolution period; see Ernst R R, Bodenhausen G and Wokaun A, (1987), "Principles of NMR Spectroscopy in one and two dimensions", Oxford Publications, Oxford. Different versions of the localized COSY sequence have been implemented by other researchers; see McKinnon G C and Bosiger P, (1988), "Localized Double Quantum filter and correlation spectroscopy experiments", *Magn Reson Med,* 6:334–343; Haase A, Schuff N, Norris D, Leibfritz D, (1987), *Proc SMRM,* 1051; Cohen Y, Chang L H, Litt L, James T L, (1989), "Spatially Localized COSY spectra from a surface coil using phase-encoding magnetic field gradients", *J Magn Reson,* 85:203–208; Blackband S J, McGovern K A, McLennan I J, (1988), "Spatially localized two-dimensional spectroscopy. SLO-COSY and SLO-NOESY", *J Magn Reson,* 79: 184–189; Behar K L, Ogino T., (1991), "Assignment of Resonance in the [1]H Spectrum of rat brain by Two-dimensional shift correlated and J-resolved NMR spectroscopy", *Magn Reson Med,* 17:285–303; de Graaf R A, Kranenburg A V and Nicolay K., (1999), "Off-resonance Metabolite Magnetization transfer measurements on rat brain in situ", *Magn Reson Med,* 41:1136–1144; Kreis R and Boesch C., (1996), "Spatially Localized, one- and two-dimensional NMR Spectroscopy and in vivo application to human muscle", *J Magn Reson,* B113:103–118. McKinnon and Bosiger proposed a conventional COSY sequence with hard rf pulses (90°-$t_1$-90°) followed by three volume selective 180° rf pulses; see McKinnon and Bosiger, supra. Haase and co-workers implemented a COSY combined with an outer volume suppressing sequence, namely the Localization of Unaffected Spins sequence, LOCUS; see Haase et al., supra. Many of these previous attempts to develop localized 2D COSY spectra yielded only phantom results or rat brain spectra using a surface coil without a built-in localization sequence; see McKinnon and Bosiger, supra; Haase et al., supra; Cohen et al., supra; Blackband et al., supra; Behar and Ogino, supra.

A new gradient enhanced COSY in combination with Volume Localized Spectroscopy (VOSY) used the Stimulated Echo Acquisition Mode (STEAM) sequence for volume localization; see Brereton I M, Galloway G J, Rose S E and Doddrell D M, (1994), "Localized two-dimensional shift correlated and J-resolved NMR spectroscopy", *Magn Reson Med,* 17:285–303. Moreover, a human brain 2D COSY spectrum using a 2T MRI scanner was recorded in a gross occipital volume of 5×6×8 cm$^3$, which required a total sampling duration of 1 hour and 42 minutes; see Brereton and Galloway et al., supra.

Non-localized versions of COSY spectra have also been recorded in rat brain and rabbit kidney by other researchers using high field NMR spectrometers; see Peres M, Fedeli O, Barrere B, et al., (1992), "In vivo identification and monitoring of changes in rat brain glucose by two-dimensional shift-correlated 1H NMR Spectroscopy", *Magn Reson Med,* 27:356–361; Berkowitz B A, Wolff S D and Balaban R S, (1988), "Detection of metabolites in vivo using 2D proton homonuclear correlated spectroscopy", *J Magn Reson,* 79:547–553.

Two major problems yet to be resolved in the localized 2D MR spectroscopy are: 1) minimizing the rf pulses used for both localization and coherence transfer taking into consideration that some of the brain metabolites have short repetition time, $T_2$, and 2) recording the localized 2D spectra of human organs in a reasonable time duration. The goals of this work are two-fold: 1) to implement a new version of a localized 2D COSY sequence (L-COSY) and its 1D analog on a 1.5 T whole body MRI/MRS scanner with a minimal number of rf pulses for volume localization and coherence transfer, and 2) to record L-COSY spectra in the frontal and occipital gray/white matter of healthy human brains.

SUMMARY OF THE INVENTION

The present invention is directed to a localized chemical shift correlated magnetic resonance spectroscopic (L-COSY) sequence, integrated into a new volume localization technique (90°-180°-90°), for use in a method of whole body magnetic resonance (MR) spectroscopy. The L-COSY sequence involves applying a pulse train of at least three high frequency (rf) pulses to localize a volume of interest, a first slice selective 90° rf pulse, a second slice selective 180° rf pulse and a last slice selective 90° rf pulse. The first and second slice selective pulses generate a first spin echo and the last slice selective 90° pulse generates a second coherence transfer echo. An incremental period $t_1$ is inserted after the first spin echo and before the last slice selective 90° pulse. Moreover, a MR signal is detected during interval $t_2$ after the last slice-selective 90° rf pulse and the MR signal data is stored for further analysis.

The 1D analog of the proposed sequence with three slice selective rf pulses (90°, 180°, 90°), CABINET, is a new volume localization sequence next to the most popular PRESS and STEAM sequences commercially available on a MRI scanner. Our new CABINET sequence is as sensitive as STEAM. This will not use the incremental periods and results in a conventional 1D spectral graph. PRESS is based on two spin echoes, STEAM on stimulated echo (single) and CABINET on two echoes (one spin-echo and one coherence transfer echo).

A preferred version of the L-COSY sequence selects a coherence transfer pathway by: (1) attaching slice-selective $B_0$ gradient pulses to the first slice selective 90° rf pulse, the second slice selective 180° rf pulse and the last 90° rf pulse; (2) applying slice refocusing $B_0$ gradient pulses after the first slice selective 90° rf pulse, before the last 90° rf pulse and after the last 90° rf pulse; and (3) applying $B_0$ gradient crusher pulses before and after the second slice selective 180° rf pulse and before and after the last 90° rf pulse.

In a preferred version of the L-COSY sequence the (90°-180°-90°) pulse train is repeated with different values of $t_1$; and the stored MR signal data is subjected to a double Fourier transformation with respect to $t_1$ and $t_2$ to obtain a two dimensional MR spectrum.

A most preferred version of the L-COSY sequence includes a step for suppressing MR signals of a solvent, such as water, which may obscure the signals of other substances within the volume of interest.

The present invention may be used as a non-invasive method for identifying brain metabolites, wherein a volume of interest, localized within a region of the brain, is subjected to the 2D L-COSY sequence. A combination of different MRI transmit/receive rf coils is used for the 2D L-COSY sequence, e.g., a head MRI coil, and a 3" surface coil receive combined with a body coil transmit. Cross peak intensities excited by the proposed 2D L-COSY sequence are asymmetric with respect to the diagonal peaks. A characteristic cross peak, corresponding to a brain metabolite, is then identified in the resulting 2D MR spectrum. For example, the J cross peaks due to N-acetyl aspartate (NAA), glutamate/glutamine (Glx), myo-inositol (ml), creatine (Cr), choline (Ch), aspartate (Asp), γ-aminobutyrate (GABA), threonine (Thr), glutathione (GSH) and macromolecules (MM) can be identified using the method of the present invention. Representative L-COSY spectra of cerebral frontal and occipital gray/white matter regions in fifteen healthy controls are presented in the examples.

Currently, there is no commercially available MR technique on a whole body MRI scanner to map various brain metabolites non-invasively in a two-dimensional map. The 2D spectral map provides the metabolite levels unambiguously. The metabolite levels can be quantitated either by projecting the volume under every 2D contour or by extracting cross sections. Accordingly, another embodiment of the present invention includes an additional step of extracting a cross-sectional one dimensional (1D) MR spectra of a metabolite from the 2D L-COSY spectrum.

BRIEF DESCRIPTION OF THE DRAWINGS

FIG. 8a) is an axial MRI of a 25-year old healthy control with the MRS voxel location shown in the occipital gray/white matter area (3×3×3 $cm^3$);

FIG. 8b) is a 2D L-COSY spectra recorded in the occipital gray/white matter area;

DETAILED DESCRIPTION

Pulse Sequence

Figure 1:
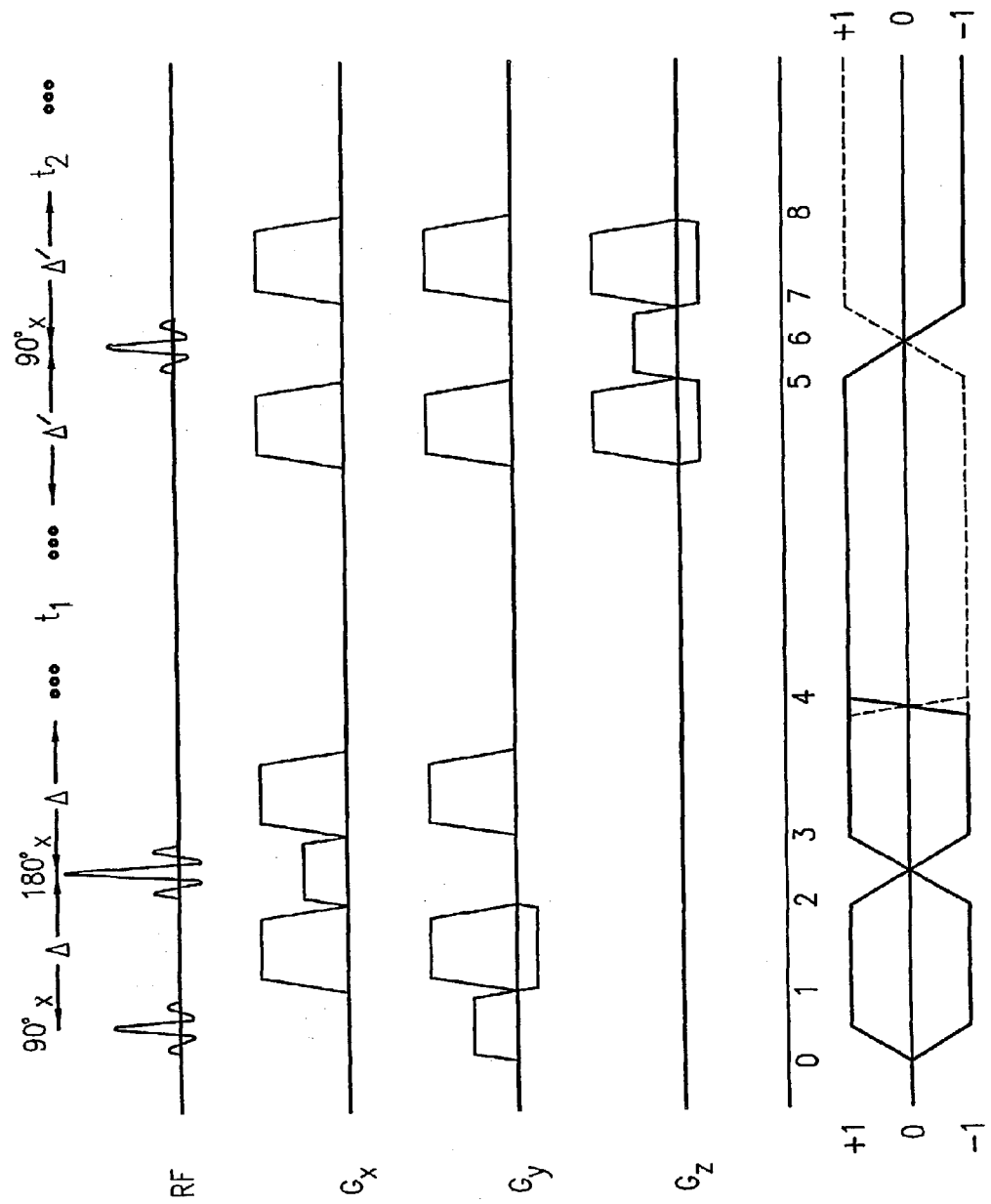
FIG. 1 is a localized two-dimensional Shift Correlated MR Spectroscopic sequence (L-COSY)

FIG. 1 is a localized two-dimensional Correlated SpectroscopY (L-COSY) sequence with the pertinent coherence transfer pathway diagram. The VOI is localized in one shot by a combination of three slice-selective rf pulses (90°-180°-90°). This new MRS volume localization sequence is called CABINET (coherence transfer based spin-echo spectroscopy). The duration of these rf pulses are 1.8 ms, 5.2 ms and 1.8 ms, respectively. The last slice-selective 90° rf pulse also acts as a coherence transfer pulse for the 2D spectrum, after an incremental period for the second dimension is inserted immediately after the formation of the first Hahn spin-echo. There are $B_0$ gradient crusher pulses before and after the slice-selective 180° rf pulse and the last 90° rf pulses, the actions of which are justified below. A minimum number of eight averages is acquired for every incremental period in order to improve the signal to noise from a localized volume. The proposed sequence can be considered as a single-shot technique in terms of volume localization and coherence transfer. However, there is a 8-step phase cycling superimposed on all the three rf pulses in order to minimize the effect of rf pulse imperfection. Each time point of the pulse sequence is marked, as shown in FIG. 1, to evaluate the time course of magnetization that will take into account the rotation after each rf pulse and the evolution during the $B_0$ gradient pulses and the incremental period. The superior feature of the proposed L-COSY sequence compared to the previously published sequences is that the volume localization and the coherence transfer for COSY are simultaneously achieved using the last slice-selective rf pulses without adding more rf or gradient pulses.

MR Parameters

L-COSY spectra are recorded using the following parameters: TR=2s; minimal TE of 30 ms; 40, 64, 128 and 256 increments of $\Delta t_1$; and 8–16 number of excitations per $\Delta t_1$. The raw data is acquired using 1024–2048 complex points and the spectral window along the first dimension is 2500 Hz. $\Delta t_1$ is incremented to yield a spectral window of 625 Hz along the second dimension. A 1.5 T whole body MRI/MRS scanner (GE Medical Systems, Waukesha, Wis.) with 'echo-speed' gradients at a slew rate of 120 µs is used. The crusher gradient pulses for the 180° and the last 90° rf pulses used a maximum amplitude of 2.2 G/cm and the duration of each pulse is 6 ms long. A frequency offset of 120 Hz is included for the three slice-selective rf pulses to minimize the voxel shifts.

Brain Phantom

A GE brain MRS phantom, MRS-HD sphere (GE Medical Systems, Milwaukee, Wis.), is used to optimize the L-COSY sequence; see Schirmer T and Auer D P, (2000), On the reliability of quantitative clinical magnetic resonance spectroscopy of the human brain, *NMR Biomed,* 13:28–36. It consists of the following chemicals: 1) N-acetyl-L-aspartic acid (NAA, 12.5 mM), 2) creatine hydrate (Cr, 10 mM), 3) choline chloride (Ch, 3 mM), 4) myo-inositol (ml, 7.5 mM), 5) L-glutamic acid (Glu, 12.5 mM), 6) DL-lactic acid (Lac, 5 mM), 7) sodium azide (0.1%), 8) potassium phosphate monobasic ($KH_2PO_4$, 50 mM) and 9) sodium hydroxide (NaOH, 56 mM). The phantom also contains 1 ml/l GdDPTA (Magnavist).

Human Subjects

Fifteen healthy volunteers (21–69 years old, mean age=33.8) have participated in this study so far. The Institutional Review Board (IRB) has approved the study.

Theory

The present invention describes a theoretical analysis to calculate: i) the volume localization efficiency of the 1D MRS signal amplitude in a single spin (I=1/2) system using the CABINET sequence and; ii) the amplitudes and phases of L-COSY diagonal and cross peaks in a weakly coupled two spin (I=1/2, S=1/2) system. A product operator formalism is used to evaluate the time course of the magnetization; see Ernst and Bodenhausen et al., supra.

In order to calculate the efficiency of volume localization with the proposed sequence, a single spin system (I) is considered first.

i) Efficiency of Volume Localization

Prior to the first slice-selective 90° rf pulse, the spin-state (I=1/2) is represented by:

$$\sigma_0 \propto I_z \quad [1.1]$$

The spin evolution during the first slice selective 90° rf pulse is calculated during three different intervals, (i) the first half, (ii) immediately after the rotation of the 90° rf pulse and (iii) the second half of the slice selective $B_0$ gradient pulse.

At the end of first half of the slice-selective pulse, the spin state is the same as shown in Equation [1.1]. After a 90° rotation along the x-axis, $$\sigma_1' \propto e^{-i\pi/2 I_x} I_z e^{i\pi/2 I_x} \propto -I_y \quad [1.2]$$

During the second half of the first slice-selection, the phase of the signal is scrambled under the influence of a $B_0$ gradient field. A pulsed gradient field modifies the angular precession of the nuclear spin I according to its spatial position.

$$\sigma_1 \propto -I_y \cos \delta_1 + I_x \sin \delta_1 \quad [1.3],$$

$$\text{where } \delta_1 = 2\pi\gamma \int \Delta B_0 d\tau \quad [1.3a]$$

A subsequent evolution under the slice refocusing gradient pulse whose area is equal to half of the slice-selective $B_0$ gradient pulse will lead to a gradient echo, $$\sigma_2' \propto -I_y \quad [1.4]$$

A symmetric pair of $B_0$-crusher gradient pulses around the second slice-selective 180° rf pulse will dephase the unwanted magnetization, but will rephase the localized magnetization. Hence, the symmetric gradient crusher pulses also dephase the unwanted magnetization when the refocusing 180° rf pulse is imperfect. After the first $B_0$ gradient crusher pulses along all the three directions, $$\sigma_2 \propto -I_y \cos \theta_1 + I_x \sin \theta_1 \quad [1.5]$$

$$\text{where } \theta_1 = 2\pi\gamma \int \Delta B_0 d\tau_1 \quad [1.5a]$$

After the rotation of a 180° rf pulse along x-direction, $$\sigma_3 \propto I_y \cos \theta_1 + I_x \sin \theta_1 \quad [1.6]$$

The 180° rf pulse is supposed to be self-refocusing which means that the transverse magnetization during the first half is dephased and subsequently rephased during the second half. Hence, we have omitted the evolution during the slice-selective $B_0$ gradient pulse attached to the refocusing 180° rf pulse. The spin state after an evolution during the second $B_0$ gradient crushers is represented by, $$\sigma_4 \propto I_y \{ \cos \theta_1 \cos \theta_2 + \sin \theta_1 \sin \theta_2 \} - I_x \{ \cos \theta_1 \sin \theta_2 - \cos \theta_2 \sin \theta_1 \} \quad [1.7]$$

$$\text{where } \theta_2 = 2\pi\gamma \int \Delta B_0 d\tau_2 \quad [1.7a]$$

When $\theta_1 = \theta_2$, $$\sigma_4 \propto I_y \quad [1.8]$$

Equation [1.8] shows the formation of a Hahn spin echo. A second pair of $B_0$ gradient crusher pulses is played around the last slice-selective 90° rf pulse. The spin state after an evolution during the first set of crusher gradient pulses can be described by, $$\sigma_5' \propto I_y \cos \theta_3 - I_x \sin \theta_3 \quad [1.9]$$

$$\text{where } \theta_3 = 2\pi\gamma \int \Delta B_0 d\tau_3 \quad [1.9a]$$

Consider a pair of pre-slice refocusing and post-slice refocusing $B_0$ gradient pulses. After the spin evolution during the pre-slice refocusing, $$\sigma_5 \propto I_y \cos \theta_3 \cos \delta_2 + I_x \cos \theta_3 \sin \delta_2 - I_x \sin \theta_3 \cos \delta_2 + I_y \sin \theta_3 \sin \delta_2 \quad [1.10]$$

$$\text{where } \delta_2 = 2\pi\gamma \int \Delta B_0 d\tau \quad [1.10a]$$

The spin state before the last 90° rf pulse rotation, $$\sigma_6' \propto I_y \cos \theta_3 - I_x \sin \theta_3 \quad [1.11]$$

The last 90° rf pulse along x-direction will turn $I_y$ into $I_z$, and $I_x$ will remain unchanged.

$$\sigma_6 \propto I_z \cos \theta_3 - I_x \sin \theta_3 \quad [1.12]$$

At this point, evolution of $I_z$ will be excluded since there will be no observable signal. After an evolution during the second half of the slice-selective $B_0$ gradient pulse, $$\sigma_7 \propto -I_x \sin \theta_3 \cos \delta_2 - I_y \sin \theta_3 \sin \delta_2 \quad [1.13]$$

The post-slice refocusing $B_0$ gradient pulse will change the spin state to $$\sigma_8' \propto -I_x \sin \theta_3 \quad [1.14]$$

The spin state after an evolution during the last set of $B_0$ gradient crushers, $$\sigma_8 \propto -I_x \cos \theta_4 \sin \theta_3 - I_y \sin \theta_4 \sin \theta_3 \quad [1.15]$$

$$\text{where } \theta_4 = 2\pi\gamma \int \Delta B_0 d\tau_4 \quad [1.15a]$$

When the gradient crushers are balanced ($\theta_3 = \theta_4$), $$\sigma_8 \propto -I_y/2 \quad [1.16]$$

In contrast to the commonly used PRESS sequence (90°-180°-180°), the CABINET sequence retains only 50% net signal from the localized volume due to a selection of only N-type echo after the last pair of $B_0$ gradient crusher pulses; see Ernst and Bodenhausen et al., supra. In the STEAM sequence (90°-90°-90°), the second 90° rf pulse along x-direction converts the transverse magnetization into i) longitudinal magnetization contributing to a stimulated echo after the last 90° rf pulse and ii) transverse magnetization which gets dephased by a strong TM-crusher gradient pulse. When the TE-crusher gradients are used, the STEAM sequence retains only 50% signal from the localized voxel due to the selection of N-type echo; see Ernst and Bodenhausen et al., supra. Our theoretical calculations as well as phantom spectra show that the volume localization efficiencies of CABINET and STEAM are the same, and both retain only 50% of magnetization compared to a full return in PRESS. However, among all the proposed localized COSY sequences so far, the proposed sequence uses only a minimal number of rf pulses; see McKinnon and Bosiger, supra; Brereton and Galloway et al., supra.

While using the inhomogeneous rf pulses delivered by a surface coil or other types, one has to consider the influence of flip-angle errors. In the CABINET sequence with the flip-angle distribution of ($\phi°$, $2\phi°$, $\phi°$), the total signal amplitude from the VOI will be scaled by a factor of $\sin^4 \phi$. The attenuation coefficient for STEAM ($\phi°$, $\phi°$, $\phi°$) will be $\sin^3 \phi$, and $\sin^5 \phi$, for the PRESS sequence ($\phi°$, $2\phi$, $2\phi°$). The STEAM sequence has the least dependence on imperfect flip angles, where as the attenuation factor will be maximum with the PRESS sequence due to the use of two refocusing rf pulses.

ii) 2D MR Spectrum Acquired by L-COSY

The amplitude and phase characteristics at different time points of a L-COSY spectrum are derived here. Prior to the first slice-selective 90° rf pulse, the spin-state is represented by $$\sigma_0 \propto I_z \quad [2.1]$$

where I is the spin under consideration and S is its J-coupled partner.

The spin evolution during the first slice selective 90° rf pulse is calculated after three different events, during the first half and the second half of the slice selective $B_0$ gradient pulse, and after the rotation of the 90° rf pulse.

At the end of first half of the slice-selective pulse, the spin state is the same as shown in equation [2.1]. After the 90° rotation along the x-axis, $$\sigma_1' \propto e^{-i\pi/2Ix} I_z e^{i\pi/2Ix} \propto -I_y \quad [2.2]$$

During the second half of the slice-selection, the signal is phase scrambled under the influence of $B_0$ gradient and the J-evolution is neglected.

$$\sigma_1 \propto -I_y \cos \delta_1 + I_x \sin \delta_1 \quad [2.3],$$

where $\delta_1 = 2\pi\gamma \int \Delta B_0 d\tau_1$ [2.3a]

The evolution under the slice refocusing gradient pulse whose area is equal to half of the slice-selective $B_0$ gradient pulse will lead to a gradient echo, $$\sigma_2' \propto -I_y \quad [2.4]$$

A symmetric pair of $B_0$-crusher gradient pulses around the second slice-selective 180° rf pulse will dephase the unwanted magnetization, but will rephase the localized magnetization. After the first $B_0$ gradient crusher pulses along all the three directions, $$\sigma_2 \propto -I_y \cos \theta_1 + I_x \sin \theta_1 \quad [2.5],$$

where $\theta_1 = \gamma \int \Delta B_0 d\tau_1$ [2.6]

After the rotation of a 180° rf pulse along the x-direction, $$\sigma_3 \propto I_y \cos \theta_1 + I_x \sin \theta_1 \quad [2.7]$$

The spin state after an evolution during the second set of crushers is represented by, $$\sigma_4' \propto I_y \cos(\theta_1 - \theta_2) - I_x \sin(\theta_1 + \theta_2) \quad [2.8]$$

when $\theta_1 = \theta_2$, formation of the first spin-echo is represented by $$\sigma_4' \propto I_y \quad [2.9]$$

The evolution due to both chemical shift and J-coupling with its coupled partner during the $t_1$ evolution is considered here.

$$\sigma_4' \propto I_y \cos(\omega_1 t_1)\cos(\pi J t_1) - 2I_x S_z \cos(\omega_1 t_1) \sin(\pi J t_1) - I_x \sin(\omega_1 t_1)\cos(\pi J t_1) \, 2I_y S_z \sin(\omega_1 t_1)\sin(\pi J t_1) \quad [2.10]$$

To simplify Equation [2.10], the following are defined:

$$A = \cos(\omega_1 t_1)\cos(\pi J t_1) \quad [2.10a]$$

$$B = \cos(\omega_1 t_1)\sin(\pi J t_1) \quad [2.10b]$$

$$C = \sin(\omega_1 t_1)\cos(\pi J t_1) \quad [2.10c]$$

$$D = \sin(\omega_1 t_1)\sin(\pi J t_1) \quad [2.10d]$$

$$\sigma_4' \propto AI_y - B2I_x S_z - XI_x - D2I_y S_z \quad [2.11]$$

A second set of $B_0$ gradient crusher pulses are transmitted around the last slice-selective 90° rf pulse. After an evolution during the first set of crusher gradient pulses, the spin state is represented by, $$\sigma_5' \propto AI_y \cos \theta_3 - AI_x \sin \theta_3 - CI_x \cos \theta_3 - CI_y \sin \theta_3 - B2I_x S_z \cos \theta_3 - B2I_y S_z \sin \theta_3 - D2I_y S_z \cos \theta_3 + D2I_x S_z \sin \theta_3 \quad [2.12]$$

The spin state before the last 90° rf pulse rotation, $$\sigma_6' \propto AI_y \cos \theta_3 - AI_x \sin \theta_3 - CI_x \cos \theta_3 - CI_y \sin \theta_3 - B2I_x S_z \cos \theta_3 - B2I_y S_z \sin \theta_3 - D2I_y S_z \cos \theta_3 + D2I_x S_z \sin \theta_3 \quad [2.13]$$

The last 90° rf pulse along x-direction will turn $I_y$ into $I_z$ and $I_x$ will remain unchanged.

$$\sigma_6 \propto AI_z \cos \theta_3 - AI_x \sin \theta_3 - CI_x \cos \theta_3 - CI_z \sin \theta_3 + B2I_x S_y \cos \theta_3 + B2I_z S_y \sin \theta_3 + D2I_z S_y \cos \theta_3 + D2I_x S_y \sin \theta_3 \quad [2.14]$$

At this point, evolution of $I_z$ and $2I_x S_y$ will be excluded since there will be no observable signal. After an evolution during the second half of the slice-selective $B_0$ gradient pulse and subsequent evolution during the post-slice refocusing $B_0$ gradient pulse will change the spin state to, $$\sigma_8' \propto AI_x \sin \theta_3 - CI_x \cos \theta_3 + B2I_z S_y \sin\theta_3 + D2I_z S_y \cos \theta_3 \quad [2.15]$$

The spin state after an evolution during the last set of $B_0$ gradient crushers, $$\sigma_8 \propto -AI_x \sin \theta_3 \cos \theta_4 - AI_y \sin \theta_3 \sin \theta_4 - CI_x \cos \theta_3 \cos \theta_4 - CI_y \cos \theta_3 \sin \theta_4 + B2I_z S_y \sin \theta_3 \cos \theta_4 - B2I_z S_x \sin \theta_3 \sin \theta_4 + D2I_z S_y \cos \theta_3 \cos \theta_4 - D2I_z S_x \cos \theta_3 \sin \theta_4 \quad [2.16]$$

The phase factors, $\theta_3$ and $\theta_4$, are defined in equations [1.9a] and [1.15a]. When the gradient crushers are balanced ($\theta_4 = \theta_3$), $$\sigma_8 \propto -0.5 \cos(\pi J t_1) [I_y \cos(\omega_1 t_1) + I_x \sin(\omega_1 t_1)] - 0.5 \sin(\pi J t_1) [2I_z S_x \cos(\omega_1 t_1) - 2I_z S_y \sin(\omega_1 t_1)] \quad [2.17]$$

The signal acquired after the last crusher gradients is given by, $$s(t_1, t_2) = \text{Tr}\{F_x \sigma_8\} \quad [2.18]$$

A double Fourier transformation along both $t_1$ and $t_2$ axes will result in a two-dimensional MR spectrum as a function of two frequency variables $(F_1, F_2)$ described by, $$S(F_1, F_2) = \int\int s(t_1, t_2) [\exp(-t_1/T_2)\exp(-t_2/T_2) \exp(-\omega_2 t_2)] [1 - \exp(-TR/T_1)] dt_1 dt_2 \quad [2.19]$$

Aue et al. reported that the diagonal peaks are dispersive where as the cross peaks are absorptive when two hard 90° rf pulses are used to acquire the COSY spectrum; see Aue W P, Bartholdi E and Ernst R R, (1976), "Two-dimensional NMR Spectroscopy", *J Chem Phys*, 64:2229–2246. A major drawback of including the gradient pulses is due to the mixed line shapes in the 2D NMR spectra; see Brereton A M, Crozier S, Filed J and Doddrell D M, (1991), "Quadrature detection in $F_1$ induced by pulsed field gradients", *J Magn Reson*, 93:54–62. Equation [2.17] clearly indicates that both the diagonal and cross peaks of an L-COSY spectrum have mixed phases along the $\omega_1$ axis. In contrast to the amplitude modulation in conventional COSY, the phase modulation in L-COSY is caused by the evolution during the $B_0$ gradient pulse during the evolution period $t_1$. Relaxation during the gradient pulses will cause further losses in signal intensities. Pure phase L-COSY spectrum can be recorded using a quadrature detection method along the $\omega_1$ axis described by Doddrell and coworkers; see Brereton and Crozier et al., supra. Absorption mode spectra can be obtained by recording two separate P- and N-type spectra and recombining the two data sets.

Results and Discussion

Figure 2A:
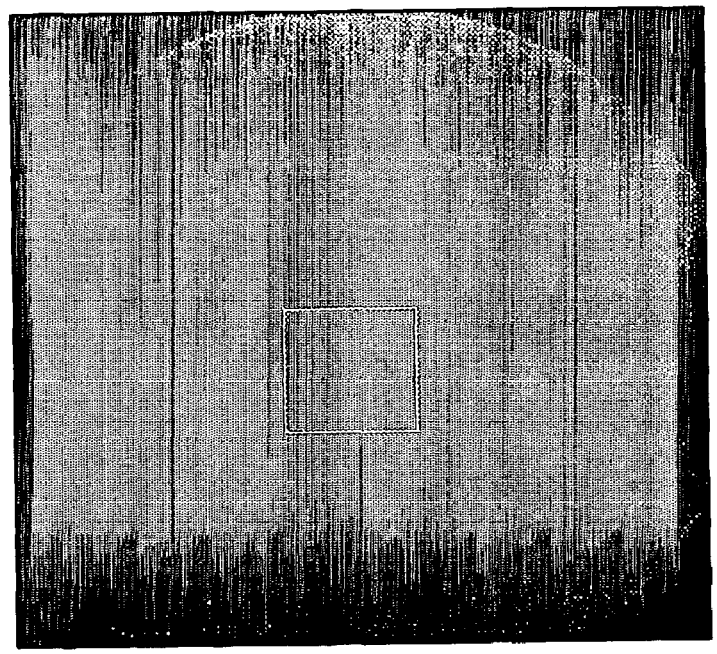
FIG. 2a) is an axial MR image of a brain phantom using the following parameters: slice thickness=5 mm, time of repetition/time for a spin echo TR/TE=500 ms/14 ms, field of view (FOV)=20 cm, matrix size of 256×256 and number of excitations (NEX)=1.
Figure 2B:
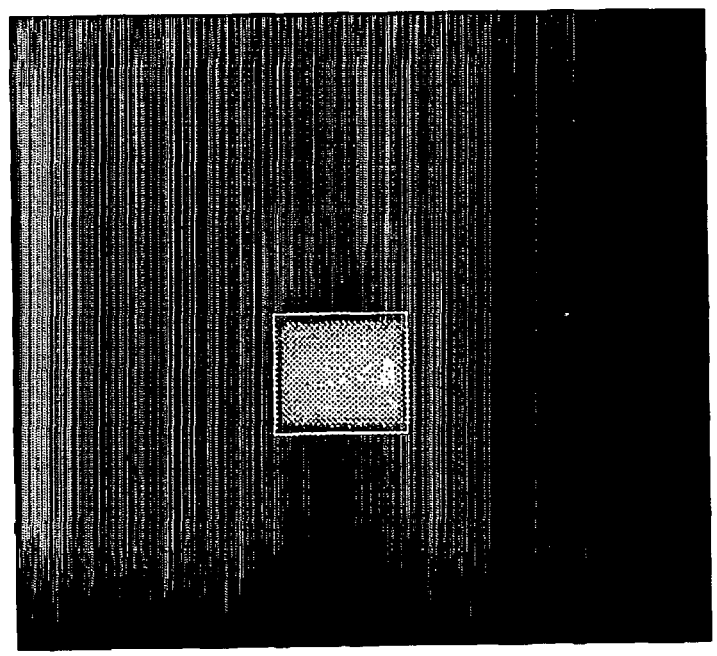
FIG. 2b) is an MR image of a 3×3×3 $cm^3$ voxel localized by the proposed CABINET sequence.

An axial $T_1$-weighted spin-echo MR image of a GE MRS phantom is shown in FIG. 2a with a voxel used for MRS. Following parameters are used to record the axial images: TR/TE=500/14 ms, FOV=16 cm, 1 NEX, 256×192. The MRS voxel image presented in FIG. 2b is recorded using the L-COSY sequence (TR/TE=1000/30 ms, FOV=16 cm, 1 NEX, 256×128). The voxel image confirmed the correctness of the volume localization part of the CABINET sequence.

Figure 2C:
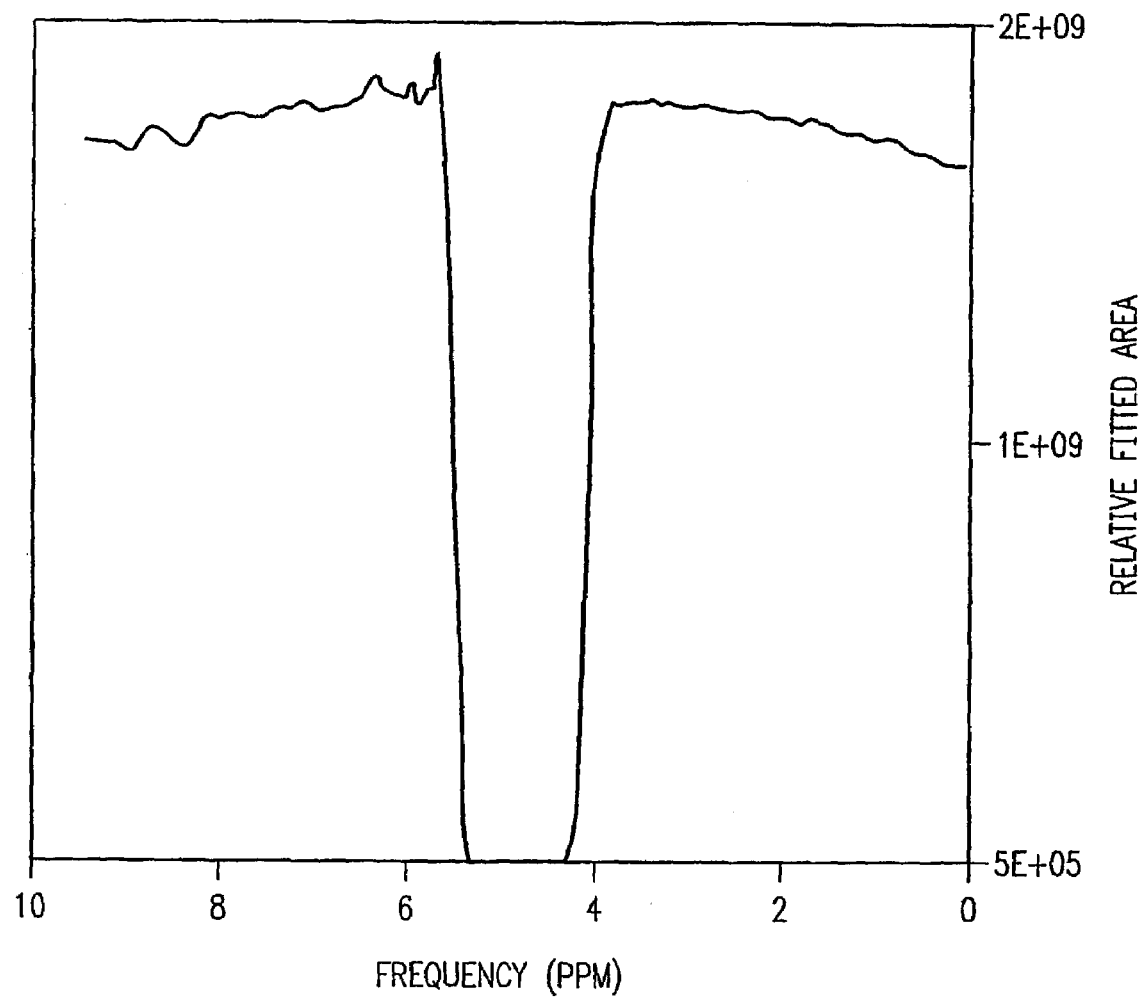
FIG. 2c) is a suppression profile recorded in a water phantom using the CABINET sequence combined with CHESS.

Prior to the localization by the CABINET sequence, a CHESS sequence of three frequency-selective water suppression pulses with a bandwidth of approximately 75 Hz was used, each followed by the dephasing $B_0$ gradient pulses. A numerically optimized Shinnar Le-Roux (SLR) waveform is used for each suppression rf pulse; see Michelis et al., supra. Since the methine proton resonances appear close to the water peak, a water suppression rf pulse will most likely saturate these resonances that lie within the rf bandwidth. In order to investigate the influence of water suppression on the cross peak amplitudes of the 2D L-COSY spectra, an offset is added to the frequency of each CHESS rf pulse. Shown in FIG. 2c is the water suppression profile with a full-width-at-half-maximum (FWHM of 80 Hz, ±0.65 ppm around water peak).

Figure 3:
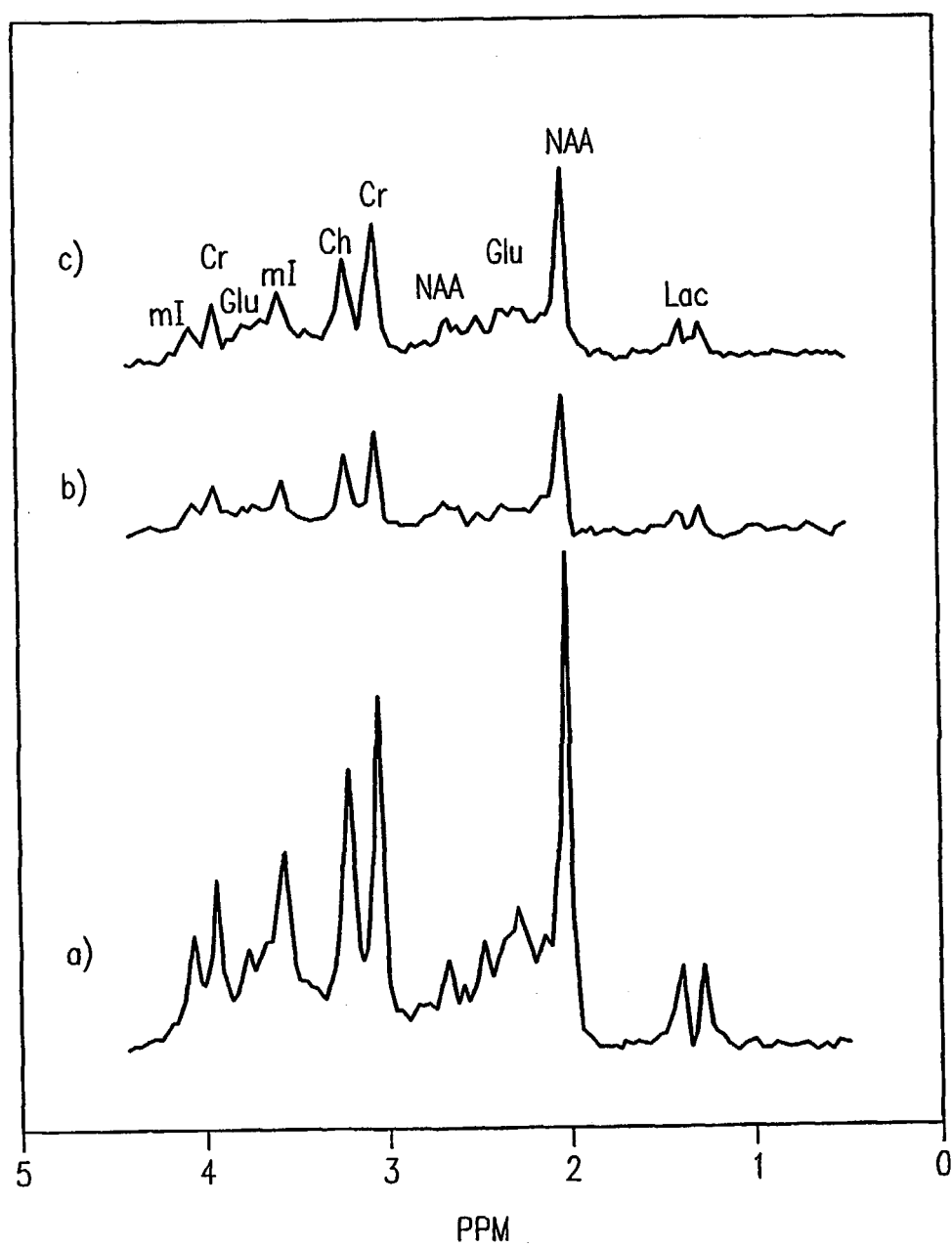
FIG. 3 is a localized one-dimensional (1D) MR spectra of a brain phantom using: a) PRESS, and b) STEAM and c) CABINET sequences.

Shown in FIG. 3 are the localized water suppressed one dimensional (1D) $^1$H MR spectra using the a) PRESS, b) STEAM and c) CABINET sequences. A voxel size of 2×2×2 cm$^3$ is used with the following parameters: TR/TE=3s/30 ms, NEX=64, spectral window of 2500 Hz, 2048 complex points and a head MRI coil. Compared to the double-spin-echo localization sequence (PRESS), only 50% signal from the localized volume is acquired by the CABINET sequence. As explained in the previous section, this is possibly due to the $B_0$ gradient crushers around the last slice-selective 90° pulse select only the N-type coherence transfer echo since the other P-type is severely broadened due to the static field inhomogeneity. A theoretical loss of 50% signal from the localized volume is evident from Equations [1.1]–[1.16]. An optimized version in which more signal can be retrieved may be achieved by addition of more rf pulses and rearrangement of $B_0$ gradient crushers.

Figure 4:
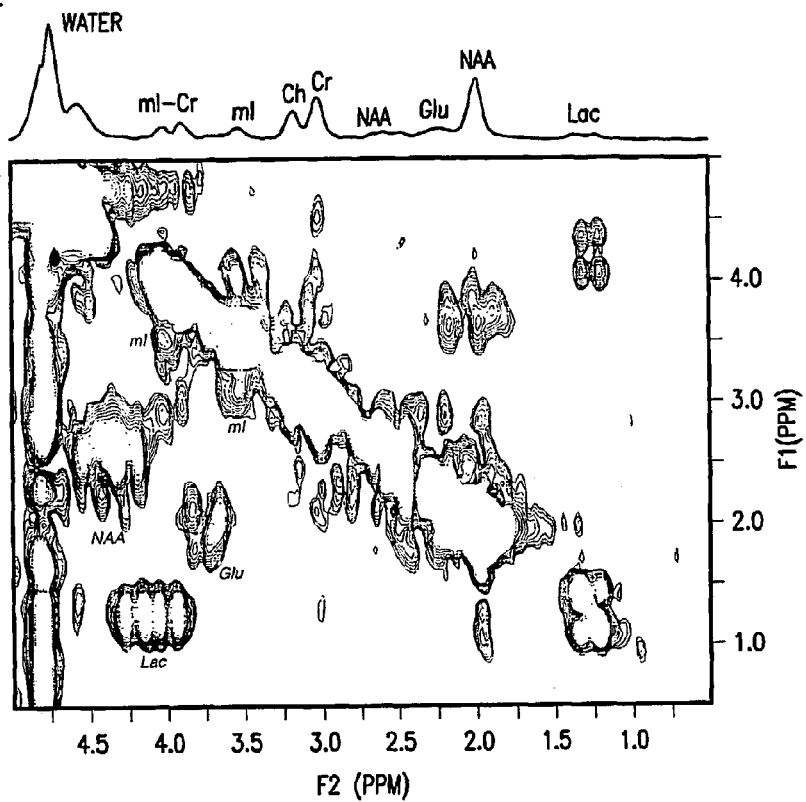
FIG. 4 is a 2D L-COSY MR spectrum of a brain phantom (TR/TE=2s/30 ms)

A 2D L-COSY spectrum of a GE MRS phantom with the cerebral metabolites at physiological concentrations and at pH=7.2 is shown in FIG. 4. A voxel size of 27 ml is localized using TR=2s and TE=30 ms. The time-domain raw signal had 1024 complex points along the $t_2$ and 64 points along the $t_1$ axes. A total of 8 averages is acquired for every $\Delta t_1$ which resulted in a total duration of 17 minutes for signal acquisition. The two-dimensional raw data is apodized with sine bell filters and zero filled to a matrix size of 2048×128 prior to double Fourier transformation. The resulting 2D spectrum is displayed in magnitude mode. The pattern of the diagonal peaks at $F_2=F_1$ resembled the conventional 1D spectral resonances, whereas the cross peaks due to J-coupling between various protons of metabolites are asymmetrically disposed on both sides of the diagonal peaks. A reference ID spectrum (projected onto $F_2$ axis) of the same phantom is also shown in FIG. 4.

The methylene and methine protons of NAA and Glu form ABX and ABCDX spin systems, respectively. In a conventional 1D spectrum, the multiplets due to the methylene protons of NAA (AB) and Glu (ABCD) resonate around 2.5 ppm and 2.2 ppm, respectively. The multiplets due to the methine protons of NAA and Glu are centered around 4.35 ppm and 3.75 ppm, respectively. The three protons in the lactate methyl and one proton in the methine group lead to an A$_3$X spin system. The multiplets due to lactate, mainly a doublet and a quartet resonate around 1.25 ppm and 4.1 ppm, respectively. The six ml ring protons, which are coupled to each other, give rise to multiplets in only three different locations at 3.1 ppm, 3.5 ppm and 4 ppm due to the symmetry of the ring.

The 2D cross peaks are predominantly monitored in the following locations:

1) NAA: (4.35 ppm, 2.5 ppm); 2) Glu: (3.75 ppm, 2.25 ppm) and (2.25 ppm, 3.75 ppm); 3) lactate: (4.1 ppm, 1.25 ppm) and (1.25 ppm, 4.1 ppm); 4) Cr: (3.9 ppm, 3.0 ppm) and (3.0 ppm, 3.9 ppm) and; 5) ml: (4.0 ppm, 3.54 ppm), (3.54 ppm, 3.1 ppm), (3.1 ppm, 3.54 ppm) and (3.54 ppm, 4.0 ppm). The absence of the NAA upper diagonal cross peaks at (2.5 ppm, 4.4 ppm) could be due to three factors: 1) the J-evolution during the first spin-echo, 2) the proximity of CH resonances to the water peak and 3) the poor resolution along the $F_1$ Dimension. The presence of these cross peaks is confirmed by recording a 2D L-COSY spectrum after deliberately adding an offset of 30 –60 Hz to the carrier frequency.

The cross peaks are asymmetric with respect to the diagonal at $F_2=F_1$. In a conventional COSY spectrum using two 90° rf pulses, the symmetric off-diagonal matrix elements of the density matrix immediately after the first 90° rf pulse lead to a coherence transfer resulting in symmetric 2D cross peaks; see Griesinger C, Gemperle C, Sorensen O W and Ernst R R, (1987), "Symmetry in coherence transfer: Application to two-dimensional NMR", *Mol Phys,* 62:295–332. Prior to the last 90° coherence transfer pulse in the L-COSY sequence, the off-diagonal elements of the density matrix corresponding to the various coherences contained in the initial spin-echo envelope facilitated by the first 90° and 180° rf pulses are no longer symmetric. Different J-coupled metabolites evolve during the first spin-echo under the influence of indirect spin-spin coupling. The strong coupling interaction inherent at 1.5 T field strength will result in a complex evolution during the first spin-echo. This means that the chemical shift between the methylene and methine protons of NAA, Glu/Gln, GABA, aspartate, etc. will not be completely refocused; see Thomas M A and Kumar A, (1982), "Influence of strong Coupling on Two-dimensional Spin-Echo Multiple-Quantum NAA. Application to oriented spin system", *J Magn Reson,* 47:535 –538.

Figure 5:
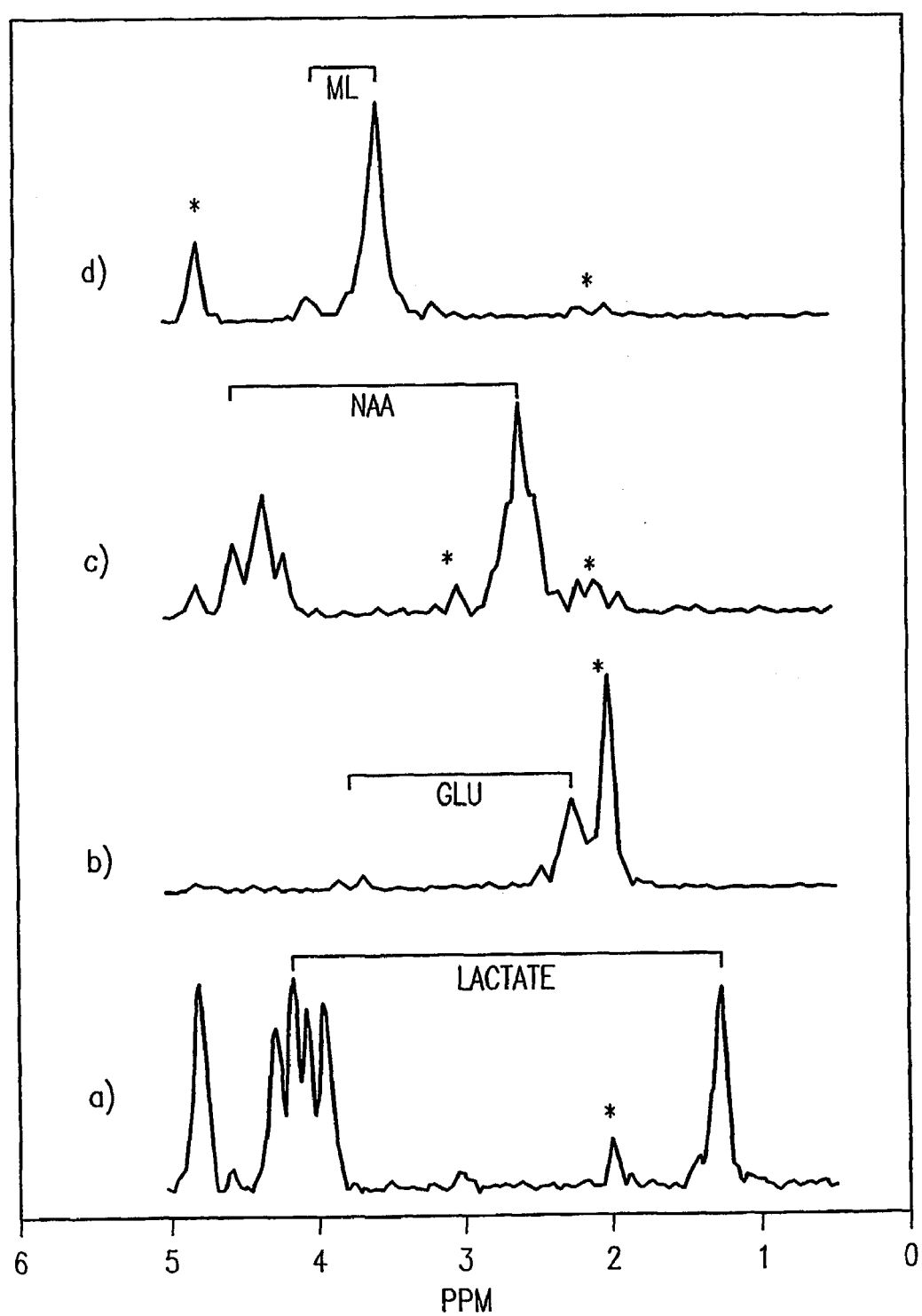
FIG. 5 is the cross-sectional 1D MR spectra extracted from the 2D L-COSY of the brain phantom shown in FIG. 4 due to: a) lactate at $F_2=F_1=1.25$ ppm, b) NAA at $F_2=F_1=2.5$ ppm, c) Glu at $F_2=F_2=2.15$ ppm and d) ml at $F_2=F_1=3.5$ ppm.

The 1D spectra have also been extracted at various cross-sections of the L-COSY spectrum; see Ernst and Bodenhausen et al., supra. The spectra shown in FIG. 5 are extracted at the center of (a) methyl of lactate (at $F_2=F_1=1.25$ ppm), (b) methylene of Glu extracted (at $F_2=F_1=2.15$ ppm) (c) methylene of NAA (at $F_2=F_1=2.5$ ppm), and (d) ml resonances (at $F_2=F_1=3.5$ ppm). The peaks denoted by * are due to the contamination originating from the $F_1$ ridges and the nearest 2D cross peaks. In lactate, the contamination is predominantly from the NAA methyl ridge at $F_2=2.0$ ppm and the water ridge $F_2=4.77$ ppm.

Figure 7A:
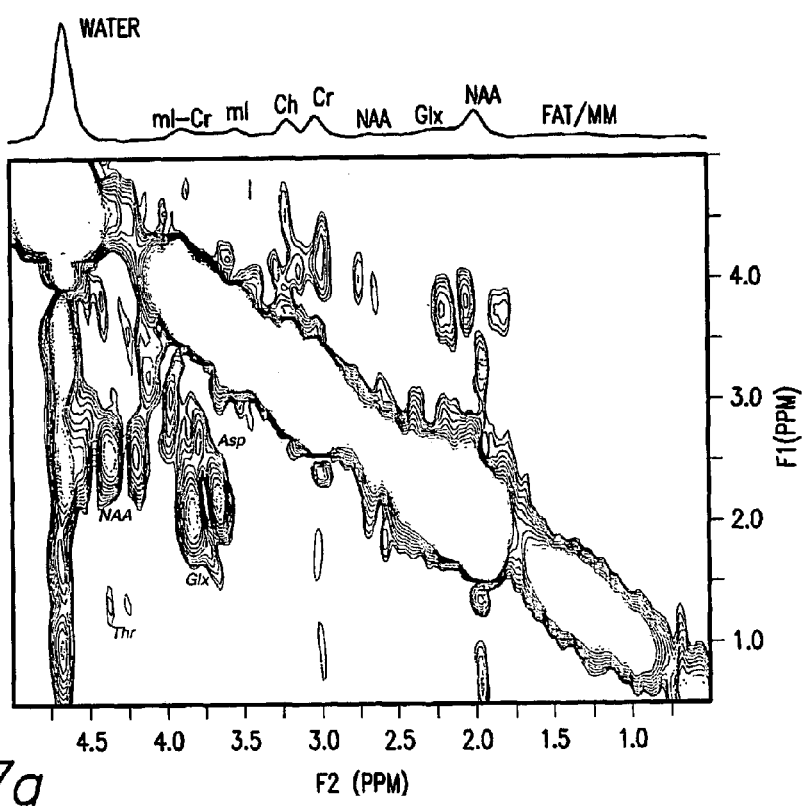
FIG. 7a) is an in vivo 2D L-COSY spectra recorded in the frontal gray/white matter area using $40\Delta t_1$.
Figure 6:
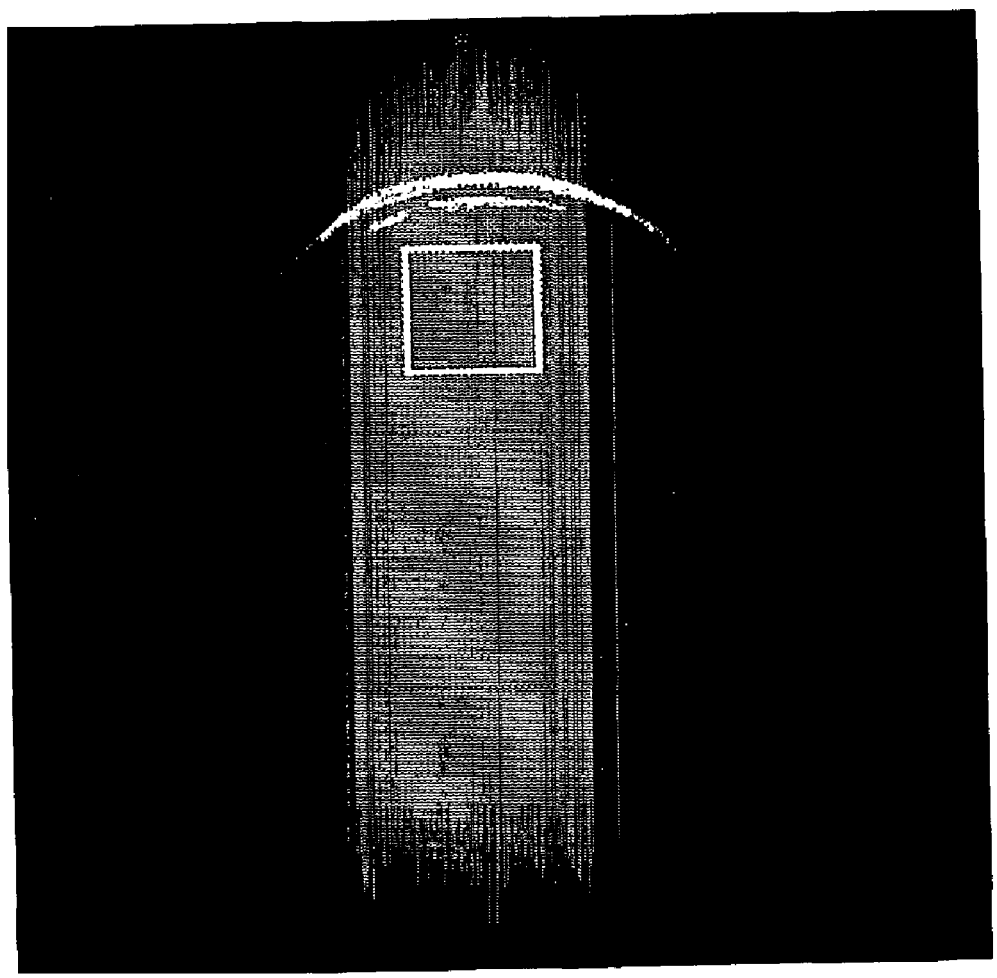
FIG. 6 is an Axial MR image of a 25 year-old healthy control.
Figure 7B:
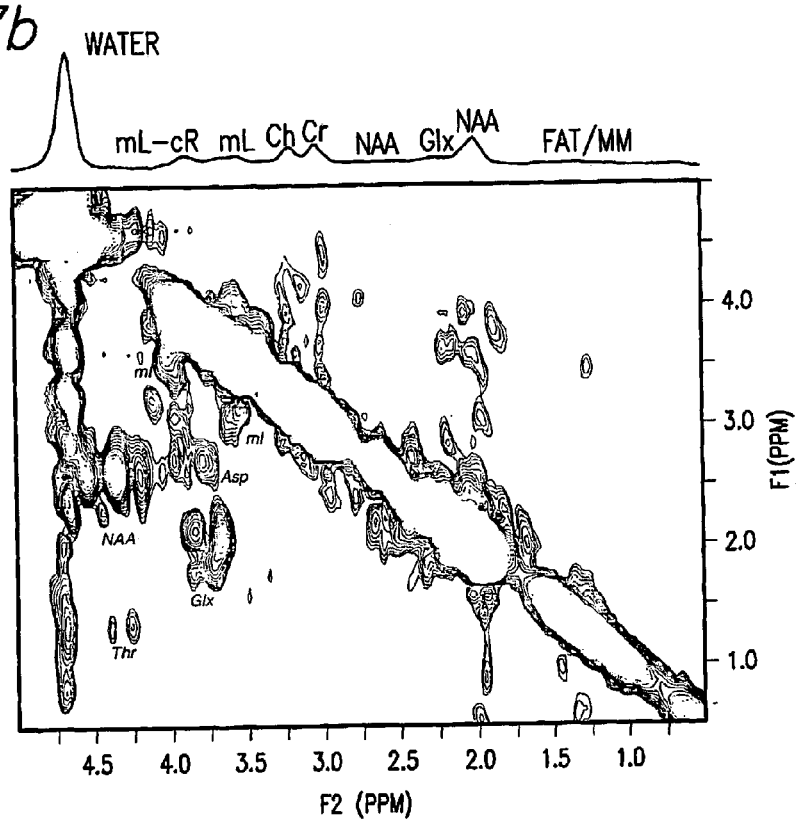
FIG. 7b) is an in vivo 2D L-COSY spectra recorded in the frontal gray/white matter area using $64\Delta t_1$.
Figure 7C:
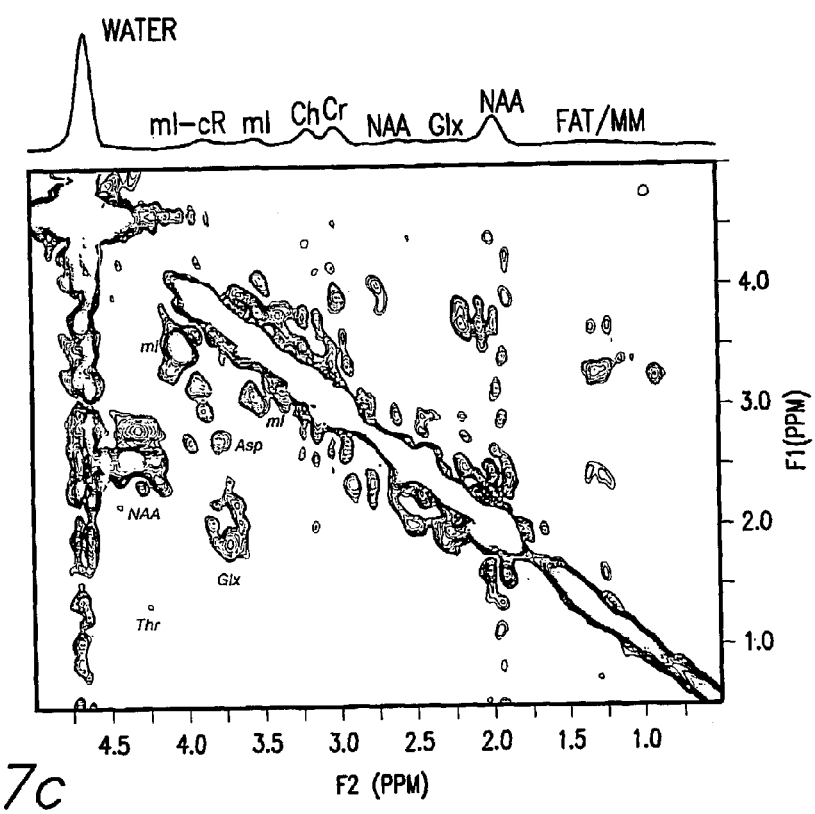
FIG. 7c) is an in vivo 2D L-COSY spectra recorded in the frontal gray/white matter area using $128\Delta t_1$.

The in vivo L-COSY cerebral spectra recorded from a 27 ml voxel localized in a 25-year old healthy volunteer are shown in FIG. 7. The MRS voxel location is in the frontal gray/white matter as shown in FIG. 6. A 3" surface receive coil is used for signal reception while the body rf coil is used for transmission for both MRI and MRS. With eight averages per $\Delta t_1$, the 2D spectra shown in FIG. 7 are acquired using a) 40$\Delta t_1$, b) 64$\Delta t_1$ and c) 128$\Delta t_1$ increments which resulted in a total duration of 35 minutes, 17 minutes and 11 minutes, respectively. As expected, both diagonal and cross peaks are severely broadened along the $F_1$ dimension when 40 digital points are used to sample the second dimension. However, the cross peaks due to NAA, Glx and other metabolites are distinctly visible. The auto-cross peaks and the cross peaks between protons, which have smaller chemical shift dispersion, are severely overlapping with the dominant diagonal peaks. Improved resolution of the cross peaks and diagonal peaks are obtained with higher $\Delta t_1$ as shown in FIGS. 7b and 7c. In particular, the cross peaks due to myo-inositol are best resolved in FIG. 7c. It is also evident that the cross peak intensities decreased with higher $\Delta t_1$ largely due to the $T_2$ losses along the $t_1$ axis.

The reported frontal gray matter metabolite concentrations of NAA and glutamate/glutamine (Glx) are 8 mM and 12 mM, respectively; see Pouwels P J W and Frahm J, "Regional metabolite concentrations in human brain as determined by quantitative localized proton MRS", *Magn Reson Med* 1998;39:53–60. The off-diagonal cross peaks due to NAA and Glx are clearly visible as demonstrated by the 1D cross-sections extracted at $F_2=F_1=2.5$ ppm (NAA) and 2.15 ppm (Glx) similar to the ones shown in FIG. 5. However, there is a severe overlap of cross peaks due to glutamate and glutamine. Separate 2D spectra of glutamate and glutamine showed the cross peaks due to glutamine are centered around the low field region ($F_1=2.35$ ppm), whereas the peaks due to glutamate are in the high field. The off-diagonal 2D cross peaks are clearly visible on both sides for Glx with intensities asymmetrically distributed whereas only lower diagonal J-cross peaks are recorded for NAA. There are also auto-cross peaks within the methylene protons of NAA and Glx, but with poor dispersion due to the closeness of these peaks to the diagonal, and the mixed phase characteristics of the diagonal peaks.

A concentration of 4 mM has been reported for mI in the frontal gray matter. There are three groups of mI peaks in the conventional 1D spectrum resonating around 3.5 ppm, 4.0 PPM and 3.15 ppm which overlap with other metabolites like Cr, Ch and Glx. There are cross peaks due to mI protons below the diagonal peaks at the following locations: ($F_2=4.0$ ppm and $F_1=3.5$ ppm), ($F_2=3.5$ ppm and $F_1=3.1$ ppm), ($F_2=3.1$ ppm and $F_1=3.5$ ppm) and ($F_2=3.5$ ppm and $F_1=3.2$ ppm). The reported concentration of choline in the frontal gray matter is around 1.3 mM. The three N-methyl protons resonate at 3.15 ppm as a singlet due to the magnetic equivalence of the nine protons. The methyl protons lead to a strong diagonal peak ($F_2=F_1=3.15$ ppm). The methylene protons resonating at 3.5 and 4 ppm, respectively, are J-coupled and they have cross peaks at ($F_2=3.5$ ppm, $F_1=4.0$ ppm) and ($F_2=4.0$ ppm, $F_1=3.5$ ppm), which are overlapping with that of myo-inositol. Due to the overlap with Ch cross peaks, the cross peaks at ($F_2=3.54$ ppm, F1=3.1 ppm) and ($F_2=3.1$ ppm, $F_1=3.54$ ppm) are less ambiguous and they are primarily due to mI.

There are two distinct singlets due to creatine/phosphocreatine (3 ppm and 3.9 ppm) in the conventional spectrum. The respective methyl and methylene protons of Cr/PCr do have measurable J-coupling which are separated by four-bond coupling. In the L-COSY spectrum, there are two strong diagonal peaks at ($F_2=F_1=3.0$ ppm) and ($F_2=F_1=3.9$ ppm) possibly due to Cr/PCr. We also identified weak cross peaks ($F_2=3.9$ ppm and $F_1=3.0$ ppm) in conformity with the previous reports; see Brereton and Galloway et al., supra; Peres et al., supra.

The concentration of free aspartate seems to be around 1.5 mM; see Pouwels and Frahm, supra. There are two cross peaks, between the methylene resonance centered at 2.8 ppm and the methine resonance at 3.8 ppm and between 2 ppm and 4 ppm, probably due to aspartate moiety; see Pouwels and Frahm, supra. A recent report by Bosiger and co-workers showed the feasibility of detecting a tripeptide, namely glutathione made up of glycine, cysteine and glutamate (GSH) in human brain using a double quantum filter; see Trabesinger A H, Webe O M, Duc Co and Boesiger P, (1999), "Detection of glutathione in the human brain in vivo by means of double quantum coherence filtering", *Magn Reson Med*, 42:283–289. A concentration of 2–3 mM has been reported for GSH. The peaks due to the methylene protons of glycine overlap with that of mI peaks at 3.5 ppm and there is no cross peak between the magnetically equivalent methylene protons due to the lack of J-coupling. The glutamate of GSH severely overlap with free glutamate peaks centered at 2.2 ppm and 3.7 ppm in a conventional 1D spectrum. The ABX spin system formed by the methylene and methine protons of cysteine appear around 2.95 PPM and 4.5 ppm. The cross peaks between the cysteine resonances at 4.5 ppm and 2.95 ppm are indistinguishable from the dominant $t_1$ ridge of water in the L-COSY spectrum, but the presence of cross peaks is confirmed whenever the water suppression is excellent.

Gamma-aminobutyric acid (GABA) is an inhibitory neurotransmitter and a concentration of 1 mM has been reported for brain GABA; see Rothman, D I, Petroff, O A C, Behar, K L and Mattson, R H, (1993), Localized $^1$H NMR measurements of γ-aminobutyric acid in human brain in vivo, *Proc Natl Acad Sci USA,* 90: 5662–5666; Keltner J R, Wald L L, Frederick B d B, Renshaw P F, (1997), In vivo detection of GABA in human brain using a localized double-quantum filter technique, *Magn Reson Med,* 37:366–371. There are three methylene protons ($A_2M_2X_2$ spin system) which appear at 3 ppm ($X_2$), 2.25 ppm ($A_2$) and 1.9 ppm ($M_2$) in a 1D spectrum and the spectral-editing techniques have been used to selectively detect one of the methylene proton resonances. The 2D cross peaks of GABA are identified at ($F_2=3.0$ ppm and $F_1=1.9$ ppm) and ($F_2=2.25$ ppm and $F_1=1.95$ ppm) when sixteen or more averages per $\Delta t_1$ are acquired. The mixed phase characteristics of the diagonal peaks are a major concern in identifying these cross peaks, which appear very close to the diagonal. Pure phase 2D spectra and increased field strength could alleviate this problem.

N-acetyl aspartyl glutamate (NAAG) is the most abundant dipeptide in brain, is not as high in concentration in the central nervous system (CNS) as NAA; see Tyson R L and Sutherland G R, (1998), Labelling of N-acetylaspartate and N-acetylaspartylglutamate in rat neocortex, hippocampus and cerebellum from [1-$^{13}$C] glucose. *Neuroscience Letters,* 251:181–184. The NAAG concentration seems to increase rostrally to caudally in the CNS (0.6–3 mM). NAAG is involved in neurotransmission as well as being a source of glutamate. As far the MR spectrum of NAAG is concerned, the peaks due to acetyl, aspartyl and glutamate moieties overlap severely with that of NAA and glutamate. At 1.5 T magnetic field strength, it is difficult to assign the NAAG peaks unambiguously, but the high field MRI scanners (>3T) may result in more resolved cross peaks; see Gruetter R, Weisdorf S A, Rajanayagan V, et al., (1998), "Resolution Improvements in vivo 1 H NMR spectra with increased magnetic field strength", *J Magn Reson,* 135:260–264.

The role of glucose in human brain has been as a source of energy and as a precursor for several metabolites; its cerebral concentration is approximately 1 mM. Due to the low field strength, there are two multiplets centered at 3.4 ppm and 3.8 PPM, in addition to an aromatic resonance at 5.2 ppm in the 1D spectrum of glucose. Even though the aromatic resonance has been detected at high field strength, we are unable to resolve a cross peak between this resonance and the high field multiplets; see Gruetter et al., supra. The cross peaks between 3.4 ppm and 3.8 ppm are too close to the diagonal peaks. Peres and co-workers are able to identify these peaks after glucose loading of the rat brain; see Peres et al., supra. A possible role of taurine as a possible neurotransmitter in the CNS and retina with a concentration of 1.5 mM in human brain has been reported. Taurine is an AA'BB' spin system at 1.5 T magnetic field strength and two triplets centered around 3.25 ppm and 3.43 ppm have been reported in a 1D spectrum; see Gruetter et al., supra. Due to the proximity to the diagonal peaks, the 2D L-COSY cross peaks are not clearly visible and a high field spectrum may show these peaks. There are only diagonal peaks between 7–7.5 PPM and at 6 PPM, and at 8 PPM which probably represent exchangeable protons of cytosolic proteins (NAA, Glx, etc.) and also, aromatic protons of adenosine nucleotides, respectively.

The presence of macromolecule resonance underlying metabolites has been reported in the cerebral spectra of animal models and a detailed analysis using 2D COSY spectra revealed the 2D cross peaks between the peaks due to macromolecules; see Behar and Ogino, supra; Kauppinen R A, Nissinen T, Karkkainen A M, et al., (1992), "Detection of Thymosin β4 in situ in a Guinea Pig Cerebral cortex preparation using $^1$H NMR Spectroscopy", *J Biol Chem*, 267: 9905–991. Some of the reported connectivities between the protons of macromolecules are also identified when larger number of averages/$\Delta t_1$ are used: ($F_2$=3.0 ppm and $F_1$=1.9 ppm), (F2=1.9 ppm and $F_1$=1.0 ppm), ($F_2$=2.0 ppm and $F_1$=0.9 ppm) and ($F_2$=1.9 ppm and $F_1$=3.0 ppm). These resonances could be possibly due to thymosin, valine, leucine, etc., previously reported as M1-M7 resonances; see Behar and Rothman et al., supra; Kauppinen et al., supra. There are also weak cross peaks at ($F_2$=4.3 ppm and $F_1$=1.25 ppm) due to threonine and also at ($F_2$=4.1 ppm and $F_1$=1.3 ppm) due to lactate/alanine as reported by Behar and coworkers; see Behar and Ogino, supra.

The L-COSY spectra are also recorded in the occipital gray/white regions. Shown in FIG. 8b is recorded in the occipital gray matter region in a 25-year old healthy volunteer with the MRS voxel location shown in FIG. 8a. The parameters used to record the L-COSY spectrum are: 3×3×3 cm$^3$, TR/TE=2s/30 ms, 1024 and 64 complex points along $t_2$ and $t_1$ dimensions, NEX=16/$\Delta t_1$, a total duration of 35 minutes for 2D acquisition, a body coil transmit and a 3" surface coil for receive. There are cross peaks due to NAA, Glx, Ch, ml, aspartate, Cr, threonine, GABA and macromolecules as shown in FIG. 8b.

Doddrell and co-workers proposed a sequence in which the localization and coherence transfer parts of the localized 2D COSY sequence are separated. A VOSY sequence, same as STEAM, is used first for voxel localization, followed by a coherence transfer hard 90° rf pulse; see Brereton and Galloway et al., supra. A problem with this sequence is due to the inferior signal compared to our L-COSY, since there is a signal loss by a factor of four, two from the localization and remaining two from the coherence transfer. Due to the severe loss of signal, they had to use a voxel size of 240 ml (5×6×8 cm$^3$) and a long acquisition time of 1 hr and 42 minutes.

The twisted line-shape of the L-COSY spectrum is advantageous for human MR spectroscopy, since a poor resolution along the $t_1$Dimension does not lead to cancellation of the cross peaks as demonstrated in FIG. 7a for NAA and Glx. However, one major problem with the mixed phase of diagonal peaks is that the auto- and cross-peaks close to the diagonal are not resolved. In particular, the cross peaks due to ml are resolved only with a better resolution where 64 and 128 $\Delta t_1$ increments are used. However, this can be overcome by recording the P-and N-type L-COSY spectra separately; see Brereton and Crozier et al., supra. A second problem is due to the so called "$t_1$-ridges"; see Ernst and Bodenhausen et al., supra. In our pilot study with twelve healthy controls, the quality of the 2D L-COSY spectra is hampered due to $t_1$-ridges only in two cases which is mainly due to subject moving.

Conclusions

In addition to the commonly used STEAM and PRESS sequences for localized in vivo MRS, a new volume localization sequence, CABINET, the 1D analogue of the L-COSY has been implemented on a whole body 1.5 T MRI/MRS scanner. Similar to the PRESS sequence, the proposed sequence is also double spin-echo based, where the first spin echo originates from the first two slice-selective 90° and 180° rf pulses and the second coherence transfer echo originates from the last slice-selective 90° rf pulse. The volume localization efficiency of the proposed sequence is only 50% the same as that of STEAM. The L-COSY spectra of a brain phantom as well as human brain in vivo showed asymmetric cross peaks for J-coupled metabolites. Localized 2D COSY spectra have been recorded in the human frontal and occipital gray/white matter regions using a minimal number of rf pulses for both volume localization and coherence transfer. The 2D J-cross peaks between the methine and methylene protons of NAA, glutamate/glutamine, myo-inositol, creatine, aspartate, threonine/lactate, GABA and macromolecules have been recorded. Even though the localization efficiency is only 50% with L-COSY compared to the 2D JPRESS sequence, the 2D cross peaks in an L-COSY spectrum have better dispersion of the J-cross peaks between various protons of cerebral metabolites; see Ryner et al., ("3D Localized 2D NMR Spectroscopy . . . "), supra; Ryner et al., ("Localized 2D J-resolved . . . "), supra; Thomas and Ryner et al., supra. The 2D J-cross peaks enable an unambiguous assignment of NAA, Glx, ml, Cr, aspartate and threonine which has been a major problem with the conventional 1D MRS. The cerebral metabolites recorded in the frontal as well as the occipital gray/white matter regions using 2D L-COSY reveal the reliability of the technique in different regions of human brain. Due to the increased signal to noise compared to a head MRI coil, a 3" surface coil is used for reception in combination with the body coil transmission. The 2D L-COSY spectra recorded at smaller volumes (8 ml or 18 ml) showed the 2D cross peaks only due to the most abundant cerebral metabolites, namely NAA, Glx and ml. The 2D cross peaks of glutamate are not distinguishable from that of glutamine at the 1.5T magnetic field strength, however high field strengths (>3T) will facilitate such differentiation. We anticipate that the absolute quantitation of several metabolites can be determined more accurately using the L-COSY spectra than the conventional 1D spectra.

BIBLIOGRAPHY

The following references are each incorporated herein by reference:

Aue W P, Bartholdi E and Ernst R R, (1976), Two-dimensional NMR Spectroscopy, J Chem Phys, 64:2229–2246.

Barberi E A, Gai J S, Ruft B K and Menon R S, (2000), A transmit-only/receive only (TORO) system for high field MRI/MRS applications, Magn Reson Med, 43:284–289.

Behar K L, Ogino T. (1991), Assignment of Resonance in the 1H Spectrum of rat brain by Two-dimensional shift correlated and J-resolved NMR spectroscopy. Magn Reson Med, 17:285–303.

Behar K L, Rothman D L, Spencer D D, Petroff O A C, (1994), Analysis of macromolecule resonance in 1H NMR spectra of human brain. Magn Reson Med, 32:294–302.

Berkowitz B A, Wolff S D and Balaban R S, (1988), Detection of metabolites in vivo using 2D proton homonuclear correlated spectroscopy, J Magn Reson, 79: 547–553.

Blackband S J, McGovern K A, McLennan I J, (1988), Spatially localized two-dimensional spectroscopy. SLO-COSY and SLO-NOESY, J Magn Reson, 79: 184–189.

Braun H, Frahm J, Gyngell M L, Merboldt K D, Hanicke W and Suter R, (1989), Cerebral metabolism in man after acute stroke: New observation using localized proton NMR Spectroscopy, Magn Reson Med, 9:126–131.

Brereton A M, Crozier S, Filed J and Doddrell D M, (1991), Quadrature detection in $F_1$ induced by pulsed field gradients, J Magn Reson, 93:54–62.

Brereton I M, Galloway G J, Rose S E and Doddrell D M, (1994), Localized two-dimensional shift correlated spectroscopy in humans at 2Tesla, Magn Reson Med, 32:251–257.

Chang L, Ernst T, Yee M L, Walot I and Singer E, (1999), Cerebral metabolite abnormalities correlate with clinical severity of HIV-1 cognitive motor complex. Neurology, 52:100–108.

Cohen Y, Chang L H, Litt L, James T L, (1989), Spatially Localized COSY spectra from a surface coil using phase-encoding magnetic field gradients, J Magn Reson, 85:203–208.

de Graaf R A, Kranenburg A V and Nicolay K, (1999), Off-resonance Metabolite Magnetization transfer measurements on rat brain in situ. Magn Reson Med, 41:1136–1144.

Dreher W and Leibfritz D, (1999), Detection of Homonuclear Decoupled in vivo proton NMR spectra using constant time chemical shift encoding: CT-PRESS, Magn Reson Ima, 17:141–150.

Ernst R R, Bodenhausen G and Wokaun A,(1987), Principles of NMR Spectroscopy in one and two dimensions, Oxford Publications, Oxford.

Ernst T, Kreis R and Ross B D,(1993), Absolute Quantitation of water and metabolites in the human brain. I. Compartments and water, J Magn Reson, B 102:1–8.

Griesinger C, Gemperle C, Sorensen O W and Ernst R R, (1987), Symmetry in coherence transfer: Application to two-dimensional NMR. Mol Phys, 62:295–332

Gruetter R, Weisdorf S A, Rajanayagan V, et al., (1998), Resolution Improvements in in vivo $^1$H NMR spectra with increased magnetic field strength. J Magn Reson, 135: 260–264.

Haase A, Schuff N, Norris D, Leibfritz D, (1987), Proc SMRM, 1051.

Hanstock, C C; Rothman, D L; Prichard, J W; Jue, T; Shulman, R G, (1988), Spatially localized NMR spectra of metabolites in the human brain, PNAS (USA), 85:1821–5.

Haseler L J, Sibbitt W L, Mojtahedzadeh H N, et al., (1998), Proton MR spectroscopic measurement of neurometabolites in HE during oral Lactulose Therapy, AJNR, 19:1681–1686.

Hurd R E, Gurr D and Sailasuta N, (1998), Proton Spectroscopy without water suppression: the oversampled J-resolved experiment, Magn Reson Med, 40:343–347.

Kauppinen R A, Nissinen T, Karkkainen A M, et al., (1992), Detection of Thymosin β4 in situ in a Guinea Pig Cerebral cortex preparation using $^1$H NMR Spectroscopy, J Biol Chem, 267: 9905–9910.

Keltner J R, Wald L L, Frederick B d B, Renshaw P F, (1997), In vivo detection of GABA in human brain using a localized double-quantum filter technique, Magn Reson Med, 37:366–371.

Kreis R and Boesch C, (1996), Spatially Localized, one- and two-dimensional NMR Spectroscopy and in vivo application to human muscle. J Magn Reson, B113:103–118.

Kreis R, Ross B D, Farrow N and Ackerman Z, (1992), Metabolic disorders of the brain in chronic hepatic encephalopathy detected with $^1$H MR Spectroscopy, Radiology, 182: 9–27.

Kuzniecky R, Hetherington H, Pan J, et al., (1997), Proton spectroscopic imaging at 4.1 tesla in patients with malformations of cortical development and epilepsy, Neurology, 48:1018–1024.

McKinnon G C and Bosiger P, (1988), Localized Double Quantum filter and correlation spectroscopy experiments, Magn Reson Med, 6:334–343.

Michelis T, Merboldt K D, Bruhn H, Hanicke W, and Frahm J, (1993), Absolute concentrations of metabolites in the adult human brain in vivo: Quantification of localized proton MR Spectra, Radiology, 187: 219–227.

Narayana P A, Doyle T J, Lai D and Wolinsky J S, (1998), Serial proton magnetic resonance spectroscopic imaging, contrast-enhanced magnetic resonance imaging, and quantitative lesion volumetry in Multiple Scelerosis, Ann Neurol, 43:56–71.

Pan J W, Mason G F, Vaughan J T,Chu W J, Zhang Y and Hetherington, (1997), $^{13}$C Editing of glutamate in human brain using J-refocused coherence transfer spectroscopy, Magn Reson Med, 37:355–358.

Peres M, Fedeli O, Barrere B, et al., (1992), In vivo identification and monitoring of changes in rat brain glucose by two-dimensional shift-correlated 1H NMR Spectroscopy, Magn Reson Med, 27:356–361.

Pouwels P J W and Frahm J, (1998), Regional metabolite concentrations in human brain as determined by quantitative localized proton MRS. Magn Reson Med, 39:53–60.

Rothman, D I, Petroff, O A C, Behar, K L and Mattson, R H, (1993), Localized $^1$H NMR measurements of γ-aminobutyric acid in human brain in vivo, Proc Natl Acad Sci USA, 90: 5662–5666.

Ryner L N, Sorenson J A and Thomas M A, (1995), 3D Localized 2D NMR Spectroscopy on an MRI scanner. J.Magn.Reson, series B, 107: 126–137.

Ryner L N, Sorenson J A and Thomas M A, (1995), Localized 2D J-Resolved 1H MR Spectroscopy: Strong coupling effects in vitro and in vivo. Magn.Reson. Ima, 13: 853–869.

Schirmer T and Auer D P, (2000), On the reliability of quantitative clinical magnetic resonance spectroscopy of the human brain, NMR Biomed, 13:28–36.

Thomas M A, Hetherington H P, Meyerhoff D J and Twieg D, (1991), Localized Double Quantum filtered NMR Spectroscopy, J Magn Reson, B93: 485–496.

Thomas M A, Huda A, Guze B et al.,(1998), Cerebral $^1$H M R Spectroscopy and Neuropsychological status of patients with Hepatic Encephalopathy, Am.J.Roentgenology, 171: 1123–1130.

Thomas M A and Kumar A, (1982), Influence of strong Coupling on Two-dimensional Spin-Echo Multiple-Quantum NAA. Application to oriented spin system. J Magn Reson, 47:535–538.

Thomas M A, Ke Y, Levitt J, et al., (1998), Preliminary Study of Frontal Lobe $^1$H MR Spectroscopy in Childhood-Onset Schizophrenia. J Magn Reson Ima, 8:841–846.

Thomas M A, Ryner L N, Mehta M, Turski P and Sorenson J A, (1996), J. Magnetic Resonance Imaging, 6: 453–459.

Trabesinger A H, Webe O M, Duc Co and Boesiger P, (1999), Detection of glutathione in the human brain in vivo by means of double quantum coherence filtering. Magn Reson Med, 42:283–289.

Tyson R L and Sutherland G R, (1998), Labelling of N-acetylaspartate and N-acetylaspartylglutamate in rat neocortex, hippocampus and cerebellum from [1-$^{13}$C]glucose. Neuroscience Letters, 251:181–184.

Webb, P., (1992), Application of crafted pulses to in vivo spectroscopy. Society of Magnetic Resonance in Medicine (SMRM) 11th annual meeting, *Book of Abstracts*, 2131.

Wilman A, Allen P, (1993), In vivo NMR detection strategies for gamma-aminobutyric acid, utilizing proton spectroscopy and coherence-pathway filtering with gradients, J Magn Reson, B101: 165–171.

What is claimed is:

1. A method of whole body magnetic resonance (MR) spectroscopy utilizing localized chemical shift correlated magnetic resonance spectroscopic sequence (L-COSY), said L-COSY sequence comprising the steps of:
    a) applying a pulse train of at least three high frequency (rf) pulses to localize in one shot a volume of interest, a first slice selective 90° rf pulse, a second slice selective 180° rf pulse and a last slice selective 90° rf pulse, wherein the first and second slice selective rf pulses generate a first spin echo and the last slice selective 90° rf pulse generates a second echo that is a coherent transfer echo;
    b) inserting an incremental period $t_1$ after the first spin echo and before the last slice selective 90° pulse; and
    c) detecting a MR signal during interval $t_2$ after the last slice-selective 90° rf pulse and storing the MR signal data.

2. The method of claim 1, further comprising the steps of:
    d) attaching slice-selective Bo gradient pulses to the first slice selective 90° rf pulse, the second slice selective 180° rf pulse and the last 90° rf pulse;
    e) applying slice refocusing Bo gradient pulses after the first slice selective 90° rf pulse, before the last 90° rf pulse and after the last 90° rf pulse;
    f) applying Bo gradient crusher pulses before and after the second slice selective 180° rf pulse and before and after the last 90° rf pulse.

3. The method of claim 2, further comprising
    g) repeating steps a) to f) with different values of $t_1$; and
    h) subjecting the stored signal data to a double Fourier transformation with respect to $t_1$ and $t_2$ to obtain a two dimensional (2D) MR spectrum.

4. The method of claim 3, further comprising suppressing MR signals of a solvent.

5. The method of claim 4 wherein the solvent is water.

6. A non-invasive method for identifying brain metabolites comprising the steps of:
    a) subjecting a volume of interest to the L-COSY sequence of claim 3, wherein the volume of interest is localized within a region of the brain;
    b) identifying at least one characteristic cross peak corresponding to a brain metabolite within the 2D MR spectrum.

7. A method according to claim 6, wherein the characteristic cross peak is asymmetric with respect to the diagonal peaks.

8. The method of claim 6, wherein the characteristic cross peak corresponds to a metabolite selected from the group consisting of N-acetyl aspartate (NAA), glutamate/glutamine (Gix), myo-inositol (ml), creatine (Cr), choline (Ch), aspartate (Asp), γ-aminobutyrate (GABA), threonine (Thr), glutathione (GSH) and macromolecules (MM).

9. The method of claim 6 wherein the region of the brain is frontal gray/white matter or occipital gray/white matter.

10. The method of claim of 6, further comprising extracting a cross-sectional one dimensional (1 D) MR spectra of a metabolite from the 2D L-COSY spectrum.

11. A method of volume localization performed on a magnetic resonance imaging (MRI) scanner utilizing a coherence transfer based spin-echo spectroscopy (CABINET) sequence, said CABINET sequence comprising the steps of:
    a) applying a pulse train of at least three high frequency (rf) pulses to localize in one shot a volume of interest, a first slice selective 90° rf pulse, a second slice selective 180° rf pulse and a last slice selective 90° rf pulse, wherein the first and second slice selective if pulses generate a first spin echo and the last slice selective 90° rf pulse generates a second echo that is a coherent transfer echo;
    b) inserting an incremental period $t_1$ after the first spin echo and before the last slice selective 90° pulse; and
    c) detecting a MR signal during interval $t_2$ after the last slice-selective 90° rf pulse and storing the MR signal data.

* * * * *